(12) United States Patent
Cavazos et al.

(10) Patent No.: US 6,771,099 B2
(45) Date of Patent: Aug. 3, 2004

(54) SYNCHRONIZER WITH ZERO METASTABILITY

(76) Inventors: Jose Alberto Cavazos, 10319 Tolman, Houston, TX (US) 77034; Robert Maurise Simle, 3802 Nasa Rd. 1, Apt. 79, Seabrook, TX (US) 77586

( * ) Notice: Subject to any disclaimer, the term of this patent is extended or adjusted under 35 U.S.C. 154(b) by 0 days.

(21) Appl. No.: 10/344,488

(22) PCT Filed: Aug. 14, 2001

(86) PCT No.: PCT/US01/25401
§ 371 (c)(1), (2), (4) Date: Feb. 12, 2003

(87) PCT Pub. No.: WO02/15403
PCT Pub. Date: Feb. 21, 2002

(65) Prior Publication Data
US 2004/0124899 A1 Jul. 1, 2004

Related U.S. Application Data
(60) Provisional application No. 60/296,015, filed on Jun. 5, 2001, provisional application No. 60/261,084, filed on Jan. 11, 2001, provisional application No. 60/227,102, filed on Aug. 22, 2000, and provisional application No. 60/224,780, filed on Aug. 14, 2000.

(51) Int. Cl.$^7$ ................................................. H03L 7/00
(52) U.S. Cl. ........................ 327/141; 327/144; 327/145
(58) Field of Search ................................ 327/141, 144, 327/145, 291, 293, 295; 326/94, 96

(56) References Cited

U.S. PATENT DOCUMENTS

| | | | | |
|---|---|---|---|---|
| 4,973,860 A | * | 11/1990 | Ludwig | 327/145 |
| 4,999,528 A | | 3/1991 | Keech | 327/198 |
| 5,331,669 A | * | 7/1994 | Wang et al. | 375/371 |
| 6,232,845 B1 | * | 5/2001 | Kingsley et al. | 331/57 |

FOREIGN PATENT DOCUMENTS

JP       4-189023       *  7/1992

OTHER PUBLICATIONS

Johnson, Howard W. and Graham, Martin, *High–Speed Digital Design: A Handbook of Black Magic*, pp. 120–130 (1993).
Stone, Harold S., *Microcomputer Interfacing*, pp. 107–108 (1983).
"Metastability in Altera Devices", *Altera Corporation Application Note*, pp. 845–854 (1999).
Johnson, Howard W., "Signal Integrity: Acceptable Failure", *EDN*, p. 32 (2000).
Dover, Rennie W. and Pearson, Todd, "Metasability and the ECLinPS Family", *ON Semiconductor Application Note* 1504/D, pp. 1–7 (2000).
Fletcher, William I., *An Engineering Approach to Digital Design*, pp. 480–485 (1980).

(List continued on next page.)

Primary Examiner—Tuan T. Lam
(74) Attorney, Agent, or Firm—Carrie A. Boone, P.C.

(57) ABSTRACT

A synchronizer eliminates metastability due to violation of either the setup time or the hold time of a circuit. The input of a first flip-flop (12a) is tied to a constant logic level (VDD or ground). The first flip-flop receives an asynchronous signal into the reset (preset or clear) input of the flip-flop. No violation of the setup or hold times of the flip-flop can occur. The second flip-flop (12c) receives the output of the first flip-flop as its clock input. The second flip-flop (12c) is configured as a toggler. The second flip-flop produces a synchronized partial signal (18a) of the original asynchronous signal (10a). Third and fourth flip-flops (12b,12d) may similarly be configured to produce a second synchronized partial signal (18b) of the asynchronous signal recovery and may prevent runt pulses from being received by the flip-flops.

57 Claims, 16 Drawing Sheets

OTHER PUBLICATIONS

Katz, Randy H., *Contemporary Logic Design*, pp. 309–313 (1994).

Grosse, Debora, "Keep Metastability From Killing Your Digital System", *EDN Access*, pp. 1–7 (1994).

Prosser, Franklin P. and Winkel, David E., *The Art of Digital Design: An introduction to Top–Down Design*, Second Edition, pp. 154–155, 505–511 (1987).

Katz, Randy H., "Sequential Logic Design", *Contemporary Logic Design*, Chapter 6, slides 38–42 (1993).

Hill, Fredrick J. and Peterson, Gerald R., *Digital Systems: Hardware Organization and Design*, pp. 321–327 (1994).

Kelly, Rick, "What Is Metasability And How To Live With It", *Synopsys Design Ware: Technical Bulletin*, V.3, 1.4, Q3, pp. 1–3 (1998).

Haseloff, Eilhard, "Metastable Response in 5–V Logic Circuits", *Texas Instruments SDYA006*, pp. 1–11 (1997).

Buchannan, James, *CMOS/TTL Digital System Design*, p. 124 (1990).

"Are your PLD's Metastable?", *Cypress Semiconductor Corp.*, pp. 1–19 (1997).

"Metastability Considerations", *XILINX, XAPP077 Application Note*, pp. 55–57 (1997).

Wakerly, John F., *Digital Design: Principles and Practice*, Third Edition, pp. 765–770, 785–786 (2000).

Jex, Jerry and Dike, Charles, "A Fast Resolving BiNMOS Synchronizer For Parallel Processor Interconnect", *IEEE Journal of Solid–State Circuits*, vol. 30, No. 2, pp. 133–139 (1995).

Ganssle, Jack, "Metastability", *The Embedded Muse 41* (2000).

\* cited by examiner

FIGURE 8A  half cycle full width, above PWmin
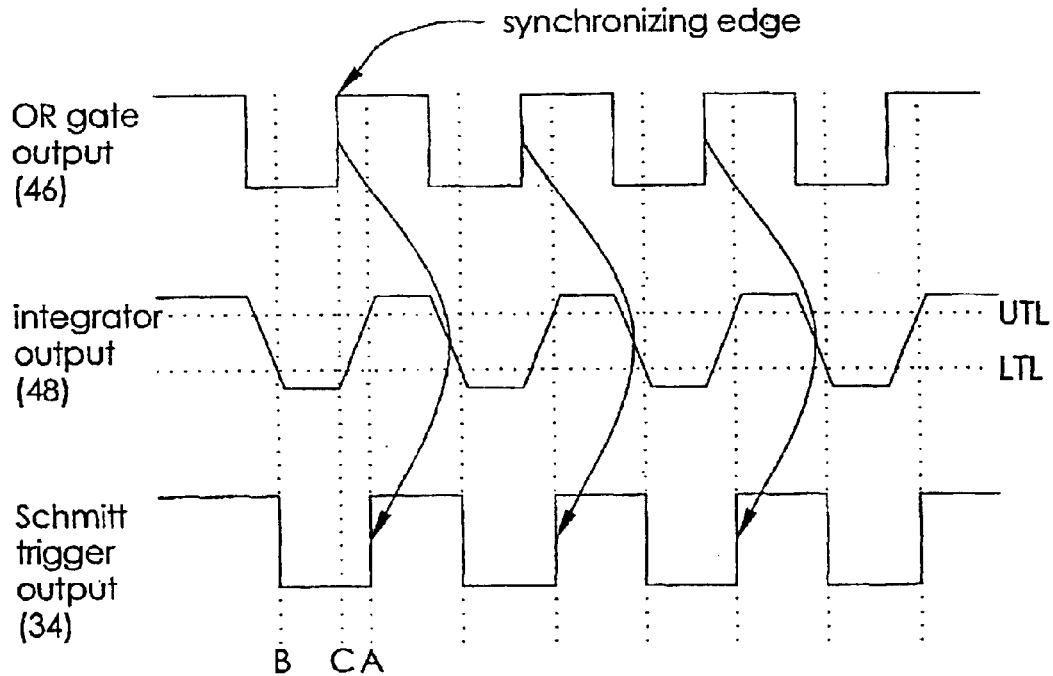
FIGURE 8B  half cycle less than full width, but above PWmin
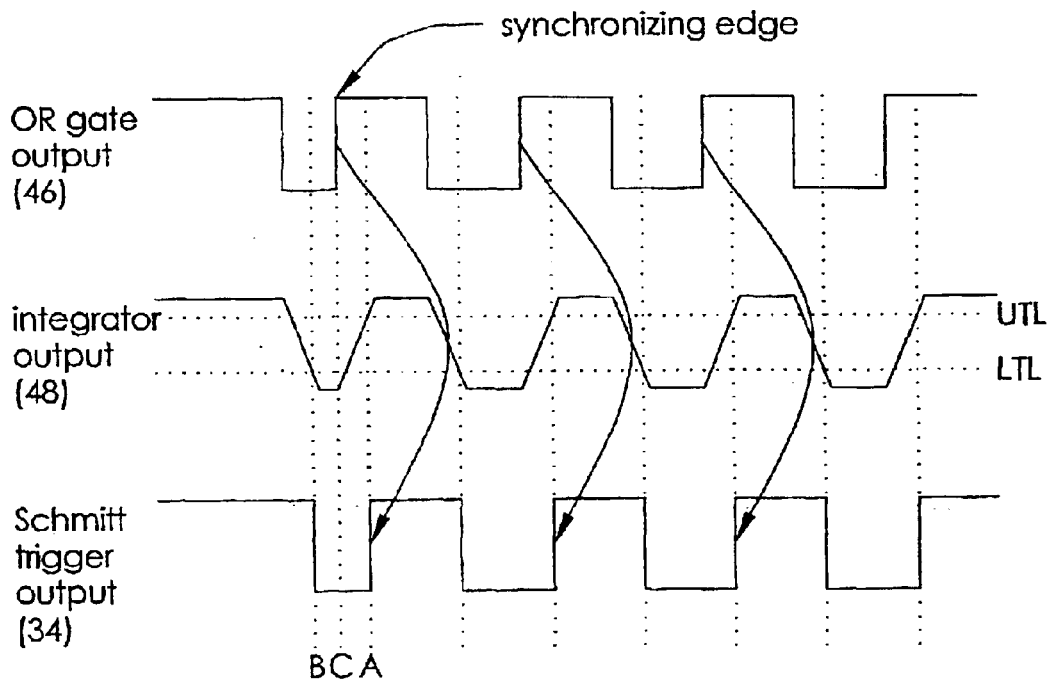

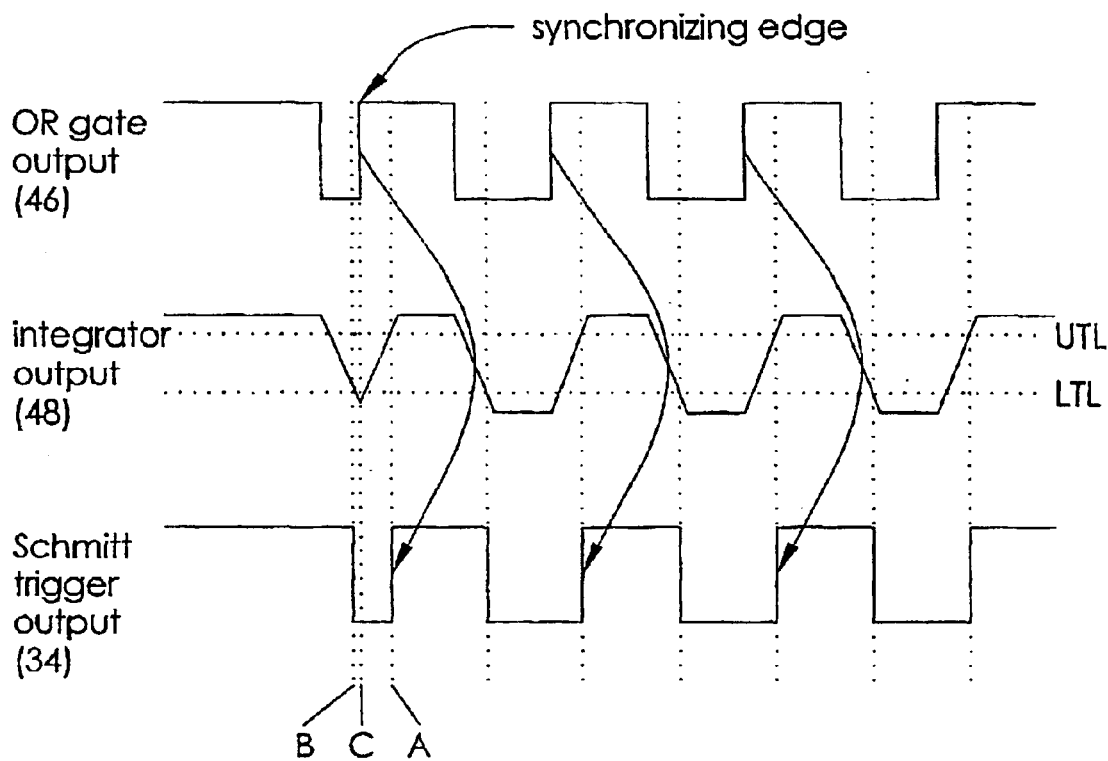
FIGURE 8C — half cycle just exceeds PWmin
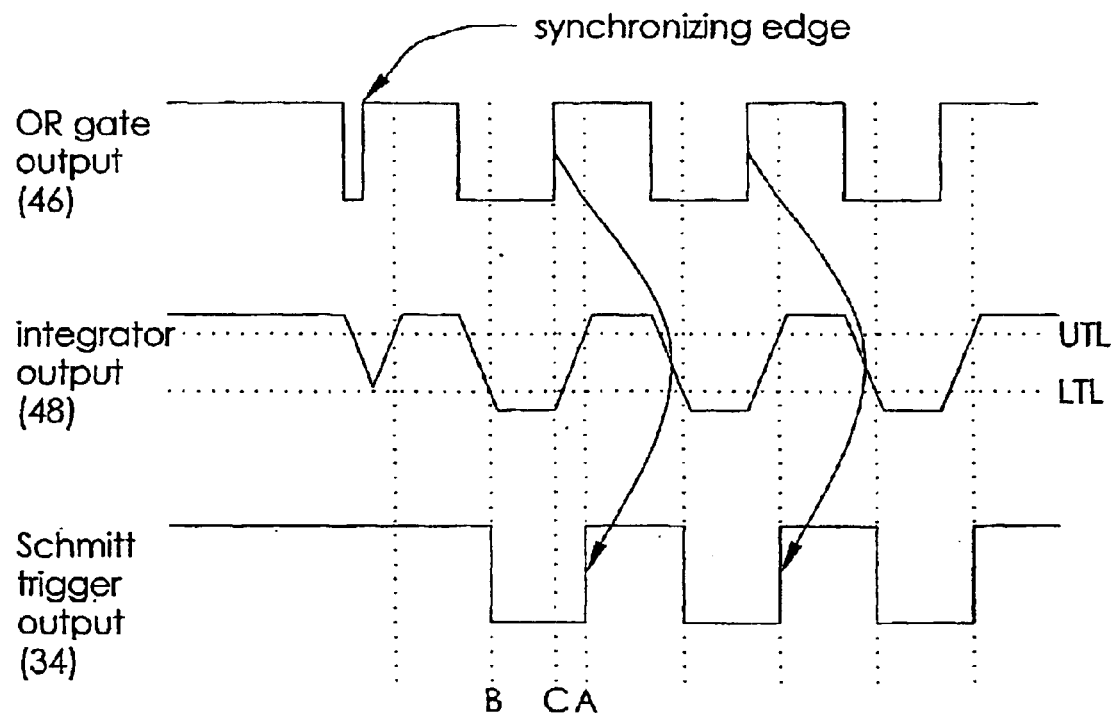
FIGURE 8D — half cycle less than PWmin hysteresis is not triggered, pulse is ignored. next cycle is passed

SYNCHRONIZER WITH ZERO METASTABILITY

CROSS REFERENCE TO RELATED APPLICATION

This application claims the benefit under 35 USC § 119 to provisional application No. 60/224,780, filed on Aug. 14, 2000; to provisional application No. 60/227,102, filed on Aug. 22, 2000; to provisional application No. 60/261,084, filed on Jan. 11, 2001; and to provisional application No. 60/296,015, filed on Jun. 5, 2001.

FIELD OF THE INVENTION

This invention relates to digital logic, and, more particularly, to digital logic devices that receive asynchronous inputs.

BACKGROUND OF THE INVENTION

In the world of computer technology, a system may include an interface to an external system. For example, a processor-based system may interface to a variety of external systems, including keyboards, modems, printers, interrupts, and other input/output (I/O) devices. These external systems may be essential to the functionality of the underlying system.

The external systems are frequently asynchronous to the underlying system. In other words, the external system is typically not bed to the internal clock mechanism of the underlying system, but, instead, operates independently and asynchronously to the underlying system.

Asynchronous inputs may be problematic for the most basic elements of the system, including digital logic components. For example, an asynchronous input to a flip-flop that violates the setup and hold times of the device may cause thee flip-flop to become unpredictable, or metastable.

In fact, such metastable behavior is expected. Specifications for flip,-flops, for example, include statistical parameters, which allow system designers to calculate information such as Mean Time Between Failures, or MTBF. The MTBF of a device indicates the likelihood of a metastable condition occurring in the device.

To avoid the metastable condition, the signal being received by the circuit, or input signal, is expected to not change and to maintain a proper logic level while being sampled by the clock. $T_{SU}$, or setup time, is the time just prior to a clock transition. The input signal is expected to remain stable for a time period of $T_{SU}$ or greater prior to the clock transition. $T_H$, the hold time, is the time just after the clock transition. The input signal is expected to remain stable for a time period of $T_H$ or greater after the clock transition. Changes to the input signal that occur between $T_{SU}$ and $T_H$ may produce unpredictable results.

Asynchronous inputs may produce metastability. Since an asynchronous input can change at any time relative to the clock, the input may be change between $T_{SU}$ and $T_H$. Various design techniques may reduce the probability of a metastable event occurring, but do not eliminate metastability.

Logic designers include circuitry, such as synchronizers, to minimize the possibility of a metastable output from a circuit. The MTBF caused by metastability is inversely proportional to the clock and data frequency. As the clock frequency increases, the time between failures decreases, such that the number of failures increases when the clock frequency increases. With lower clock frequencies, however, a lower sampling resolution, and thus, higher jitter in the synchronized data stream, is produced. Digital logic designers thus tradeoff the amount of jitter that is introduced into the synchronized signal and an acceptable MTBF.

As system clock frequencies increase, the metastability problem likewise increases. In some environments, metastability adversely affects system reliability. Where unexplained system crashes and other unresolved failures occur, metastability may be the culprit.

There exists a widely held belief that metastability cannot be eliminated entirely and that a synchronizer cannot completely eliminate metastability when sampling an asynchronous signal.

SUMMARY OF THE INVENTION

In one embodiment, a system is disclosed comprising a first flip-flop with an input tied to a constant logic level, an asynchronous input, a clock input, and an output, a second flip-flop coupled as a toggler, the second flip-flop comprising a clock input coupled to the output of the first flip-flop and an output. An asynchronous signal is received into the asynchronous input of the first flip-flop and a synchronized signal is received from the output of the second flip-flop.

In a second embodiment, a method is disclosed in which a first constant logic level signal is received by a first flip-flop input an asynchronous signal is received by a first flip-flop asynchronous input, a first flip-flop output signal is received by a second flip-flop clock input, and a first synchronized signal is produced in which the first synchronized signal is synchronized to a system clock received by a first flip-flop clock input.

Advantages and other features of the invention will become apparent from the following description, the drawings, and the claims. dr

BRIEF DESCRIPTION OF THE DRAWINGS

FIGS. 8A–8D are timing diagrams of the pulse width discriminator of FIG. 7 according to one embodiment of the invention;

DETAILED DESCRIPTION

In accordance with the embodiments described herein, a synchronizer eliminates metastability when sampling an asynchronous signal. The synchronizer separates the rising and falling edge events of the asynchronous signal being sampled. A pair of half-rate partial signals is generated and processed in parallel. Each of the half-rate partial signals is generated such that all of its edge events are synchronized to the clock.

In one embodiment, each of the partial signals represents part of the original asynchronous signal received. The partial signals may optionally be recombined to recover the original asynchronous signal at its original full rate. However, the combined signal is now synchronized to the clock, since it is generated from the synchronized partial signals.

Figure 1:
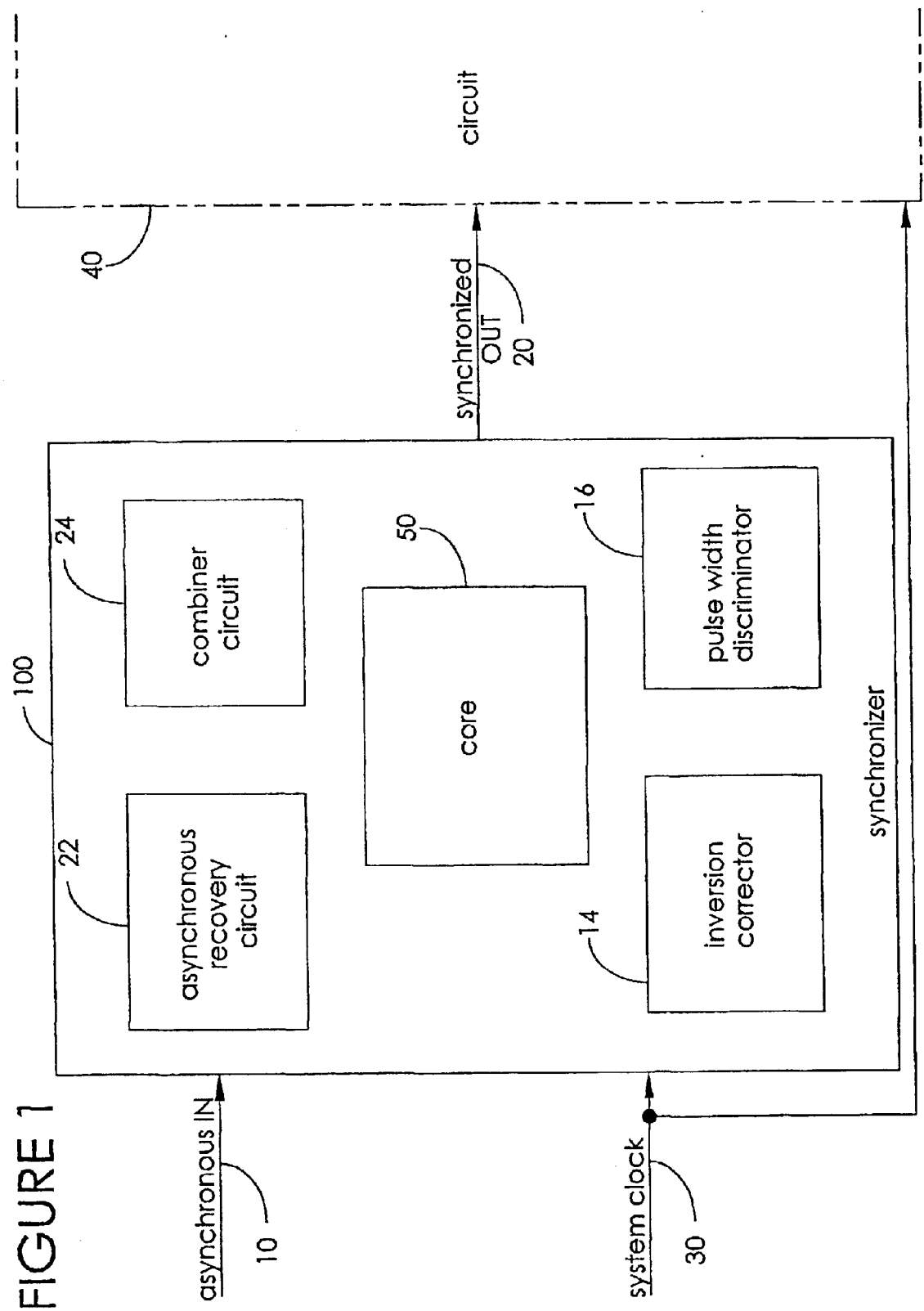
FIG. 1 is a block diagram of the synchronizer according to one embodiment of the invention.

In FIG. 1, according to one embodiment, a synchronizer 100 receives an asynchronous signal 10 and produces a synchronized signal 20. The synchronized signal 20 is synchronized to a system clock 30, which is also received by the synchronizer 100.

The synchronizer 100 may interface with a circuit 40 intending to receive the asynchronous signal 10. As is shown, the synchronizer 100 converts the asynchronous signal 10 into the synchronized signal 20, then sends the synchronized signal 20 to the circuit 40.

In one embodiment, the system clock 30 is received by the circuit 40, as well as the synchronized data signal 20. The system clock 30 may be one of many clocks used to operate the circuit 40.

The circuit 40 may include any of a variety of logic devices that receive asynchronous data inputs. For example, a system board of a processor-based system, such as a desktop or laptop computer, may receive asynchronous signals from a number of sources, including parallel port signals, such as from a printer, serial port signals, such as from a modem device, and so on. The system board of a processor-based system is a familiar example of a circuit that receives asynchronous data. Nevertheless, the circuit 40 of FIG. 1 is not limited to system boards.

In one embodiment, the synchronizer 100 includes the following functional units: a core 50, a combiner circuit 24, an asynchronous recovery circuit 22, a pulse width discriminator 16, and an inversion corrector 14. The synchronized 100 may include one or more of these functional units, depending on the needs of the system designer. Each of these functional units is discussed, in turn.

In the following paragraphs and in the figures, reference is made to a particular digital logic device: a D flip-flop. The D flip-flops described herein are edge-triggered devices that are triggered on the rising edge of an incoming clock signal. However, the invention may be practiced using other types of logic devices, including, but not limited to, T flip-flops, SR flip-flops, and JK flip-flops. Or, the invention may be practiced using transistors that are equivalent to the logic devices.

Additionally, logic substitutions may be practiced to accommodate inverted logic. For example, identical functionality may be achieved with a NAND; gate instead of an OR gate when utilizing inverted inputs. Furthermore, the logic devices used to practice the invention may be triggered on the falling edge of an incoming signal, or active high signals may be substituted for active low signals to accommodate inverted logic.

Further, the invention may be practiced with hardware descriptive languages, rather than using circuit schematic descriptions. Other modifications to the described embodiments, familiar to those of ordinary skill in the art, may likewise be made without departing from the spirit of the invention.

The Core

Figure 2:
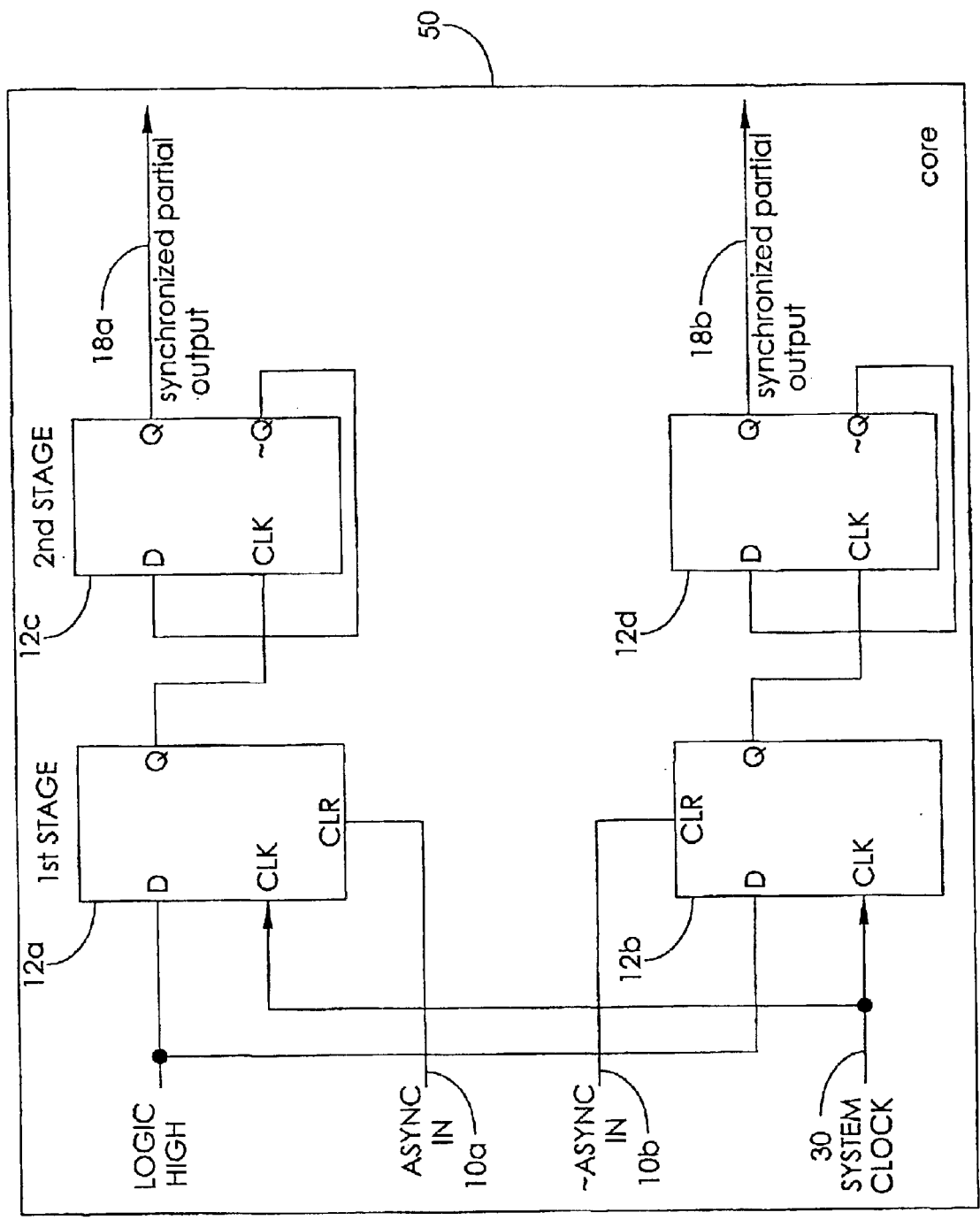
FIG. 2 is a block diagram of the core of the synchronizer of FIG. 1 according to one embodiment of the invention.

FIG. 2 is a block diagram of the core 50 of the synchronizer 100 of FIG. 1, according to one embodiment The core 50 includes four flip-flops 12, arranged in two stages, with two flip-flops at each stage. In one embodiment, the flip-flops 12 are D flip-flops. The core 50 receives both the asynchronous IN signal 10 and the system clock signal 30 and produces synchronized partial outputs, or partials, 18a and 18b.

D flip-flops are commonly used in logic design. Each D-flip-flop may include some or all of the following: an input (D), a clock input (CLK), a first output (Q), which is a Boolean value, a second output (~Q), which has a Boolean value opposite to Q, a preset input (PR), and a clear input (CLR).

D flip-flops are sometimes associated with memory because the D flip-flop remembers, or temporarily stores, a bit of data. In an edge-triggered D flip-flop, for example, the Q output is equal to the D input delayed by a propagation delay $T_{PD}$ after the clock edge. The optional preset (PR) and clear (CLR) inputs are used to set or reset the state of the D flip-flop asynchronously. PR and CLR are asynchronous inputs for the flip-flop.

In FIG. 2, the D flip-flops 12 are identified as being part of a first stage or a second stage. The first stage flip-flops are flip-flops 12a and 12b; the second stage flip-flops are flip-flops 12c and 12d. The second stage flip-flops 12c and 12d are equivalent to a T flip-flop. At each flip-flop, the input D is sent to the output Q upon the rising edge of CLK.

The flip-flops 12 are each illustrated as having a Q output and a ~Q output The Q output is also known as a "true" output while the ~Q output is also known as a "complement" output. Although each flip-flop in FIG. 2 is shown having both a true and a complement output, the invention may be practiced with flip-flops that do not have both the true and the complement output.

Conventionally, the D flip-flop 12 receives a signal, such as the asynchronous IN signal 10, into the D input. According to the embodiment of FIG. 2, however, the D inputs to the first stage flip-flops 12a and 12b are tied to a logic high, or Boolean "1." Instead, the asynchronous IN signal 10a is received by the CLR input in D flip-flop 12a and an inverted asynchronous IN signal 10b is received by the CLR input in D flip-flop 12b. In other words, the asynchronous IN signal 10a and its complement (10b) are sent to the first stage flip-flops 12a: and 12b, respectively. The system clock 30 is received into the CLK inputs of both D flip-flops 12a and 12b.

In the configuration depicted in FIG. 2, no metastable condition, due to violations of $T_{SU}$ or $T_H$, can occur with the first stage flip-flops 12a and 12b. This is because the D inputs of each flip-flop are tied to a constant logic level. No matter what the rate of the system clock 30 is, a violation of neither $T_{SU}$ nor $T_H$ can occur.

At flip-flop 12a, the rising edge of the asynchronous IN signal 10a removes (negates) the CLR input of the flip-flop 12a. This allows the logic high D input to be latched on the next rising edge of the system clock 30. Likewise, at flip-flop 12b, the rising edge of the inverted asynchronous IN signal 10b removes (negates) the CLR input of the flip-flop 12b, allowing the logic high D input to be latched on the next rising edge of the system clock 30.

In FIG. 2, the asynchronous IN signal 10a is received by the core 50 from an external source (not shown). The complement, or inverted asynchronous IN signal 10b, may also be received from a source external to the core 50 or may be generated from within the core, such as by inverting the asynchronous IN signal 10a. Logic designers of ordinary skill in the art recognize that the asynchronous IN signal 10a may be used to derive the inverted asynchronous IN signal 10b in a variety of ways.

Once the D input is latched from either of the first-stage flip-flops 12a or 12b, the previously low Q output goes high. As shown in FIG. 2, the Q output of flip-flop 12a (12b) is connected to the CLK input of flip-flop 12c (12d). When the Q output of flip-flop 12a (12b) goes high, a rising edge on the second stage flip-flop 12c (12d) CLK input is received.

At the second stage, the previously clocked ~Q output of the flip-flop 12c (12d) is available at its D input The rising clock edge from the Q output of the flip-flop 12a (12b) latches the inversion (~Q) of the previously clocked value in flip-flops 12c (12d). The Q output of flip-flop 12c (12d) then toggles. In one embodiment, the second stage flip-flops operate as T flip-flops or toggle flip-flops.

The Q outputs for both of the second stage flip-flops are partial synchronized signals, or partials, 18a and 18b. If preferred, these signals may be combined using the combiner circuit 24 of the synchronizer 100, as described further below. In the core 50, the partials produced are synchronized to the system clock 30 from the incoming asynchronous signal 10.

During processing, though, some asynchronous data is nevertheless produced. For example, when the asynchronous IN signal 10a goes low, the Q output of flip-flop 12a is reset. The Q output falling edge from the flip-flop 12a is asynchronous, but does not affect the output Q of the flip-flop 12c at the second stage, eliminating any response to the asynchronous edge. Likewise, when the inverted asynchronous IN signal 10b goes low, the Q output of the flip-flop 12b is reset. The Q output falling edge from the flip-flop 12b is asynchronous, but does not affect the output Q of the flip-flop 12d. From the second stage flip-flops, only synchronized data is produced.

Figure 3:
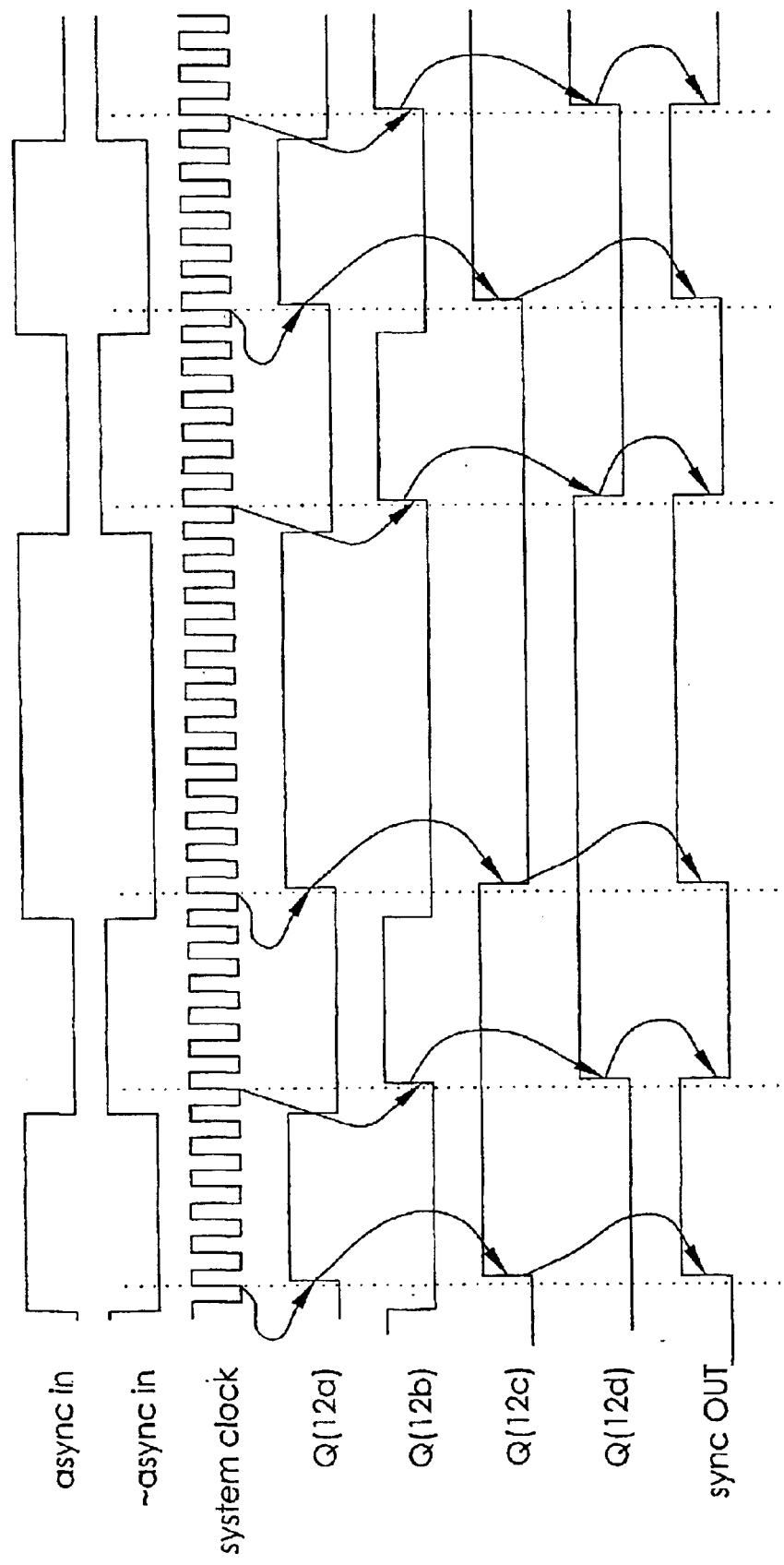
FIG. 3 is a timing diagram of the core of FIG. 2 according to one embodiment of the invention.

A timing diagram of the core 50 is shown in FIG. 3, according to one embodiment. The asynchronous IN signal 10a and its complement (10b) are shown, as well as the system clock 30. Q outputs from all four flip-flops (12a, 12b, 12c, and 12d), as well as the synchronized partials 18a and 18b are also illustrated. Vertical lines in the timing diagram denote a rising edge of the system clock 30 following an asynchronous IN event (e.g., a change in logic state of the signal 10a or 10b).

As FIG. 3 shows, the Q outputs at the first stage (12a and 12b) contain synchronized rising edges and asynchronous falling edges, relative to the system clock. However, these asynchronous signals are fed into the second stage flip-flops as the CLK inputs, such that the second stage Q outputs (12c and 12d) are synchronized to the system clock 30.

In one embodiment, the synchronized partials 18a and 18b are each half the rate of the original asynchronous signal. These signals 18 are completely synchronized to the system clock 30, since their edge events are launched by the rising clock edges at the clock inputs of the first stage flip-flops 12a and 12b.

The synchronized partials 18a and 18b are not pattern identical to the original asynchronous signal 10. Although the synchronized partials 18a and 18b include events (e.g., low-to-high or high-to-low transitions) that correspond to the asynchronous IN signal 10, the timing is synchronized to the system clock 30.

As shown in FIG. 3, signal 18a, or Q (12c), reflects low-to-high transition events of the asynchronous IN signal, synchronized to the next rising edge of the system clock. Likewise, signal 18b, or Q (12d), reflects high-to-low transition events of the asynchronous IN signal, also synchronized to the next rising edge of the system clock.

Combiner Circuit

Figure 4:
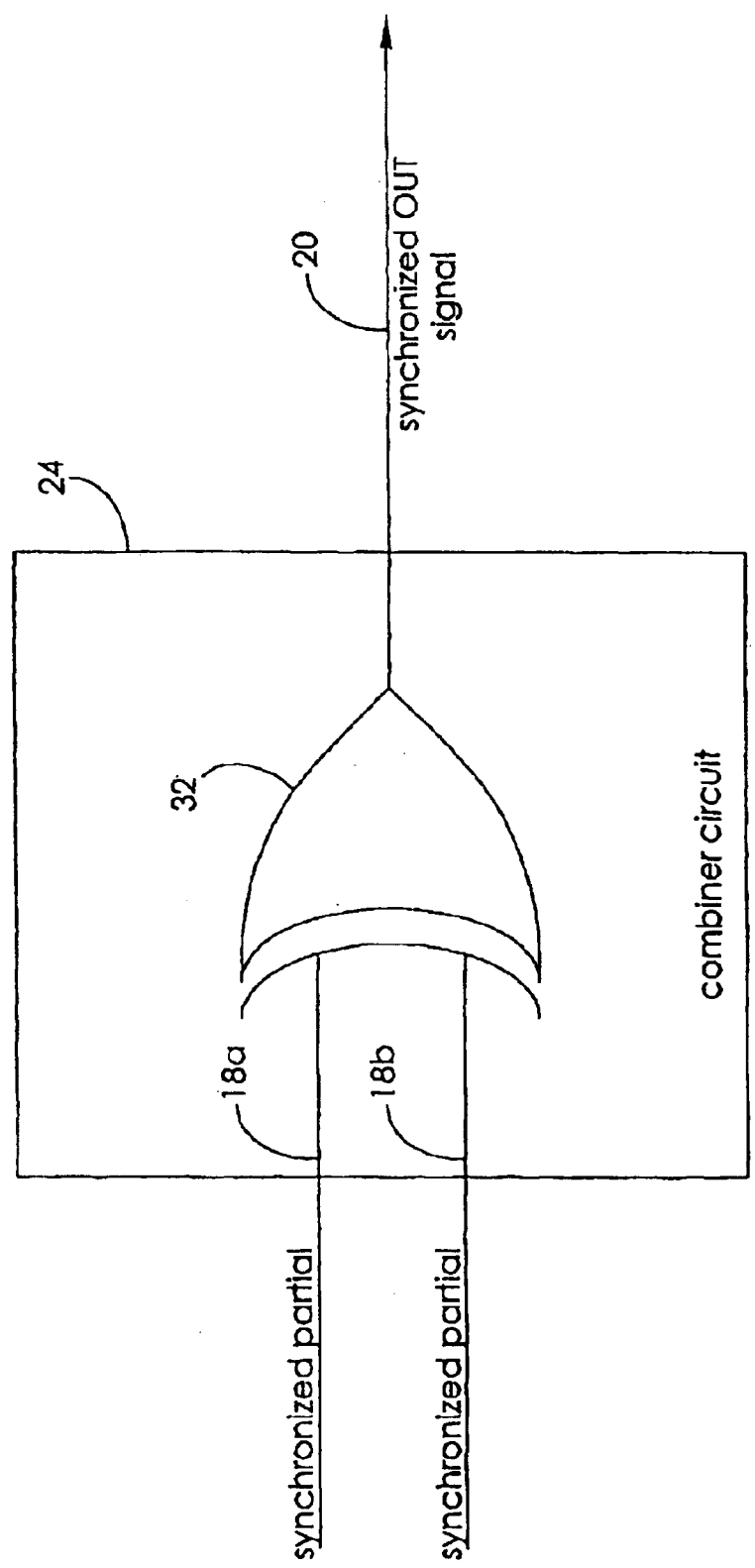
FIG. 4 is a block diagram of the combiner circuit of FIG. 1 according to one embodiment of the invention.

Returning to FIG. 1, the synchronizer 100 may optionally include a combiner circuit 24. As shown in FIG. 4, the combiner circuit 24 receives the synchronized partials 18a and 18b and produces the synchronized OUT signal 20.

Figure 4A:
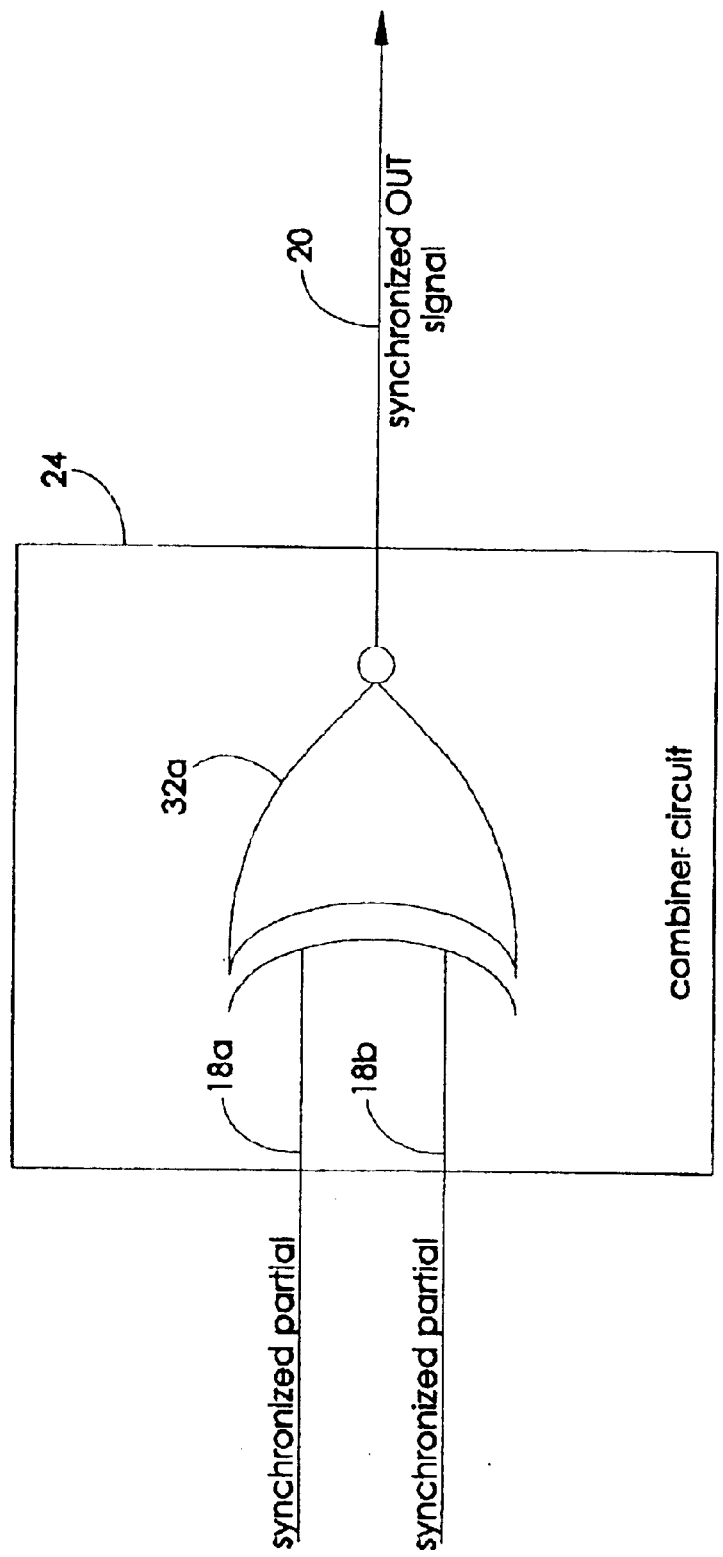
FIG. 4a is a block diagram of the combiner circuit of FIG. 1 according to a second embodiment of the invention.

In one embodiment, the partials 18 are fed into an XOR gate 32, to produce the single synchronized out signal 20. In a second embodiment, an XNOR gate is used to combine the partials 18 into a single synchronized signal (see FIG. 4a.

Figure 2A:
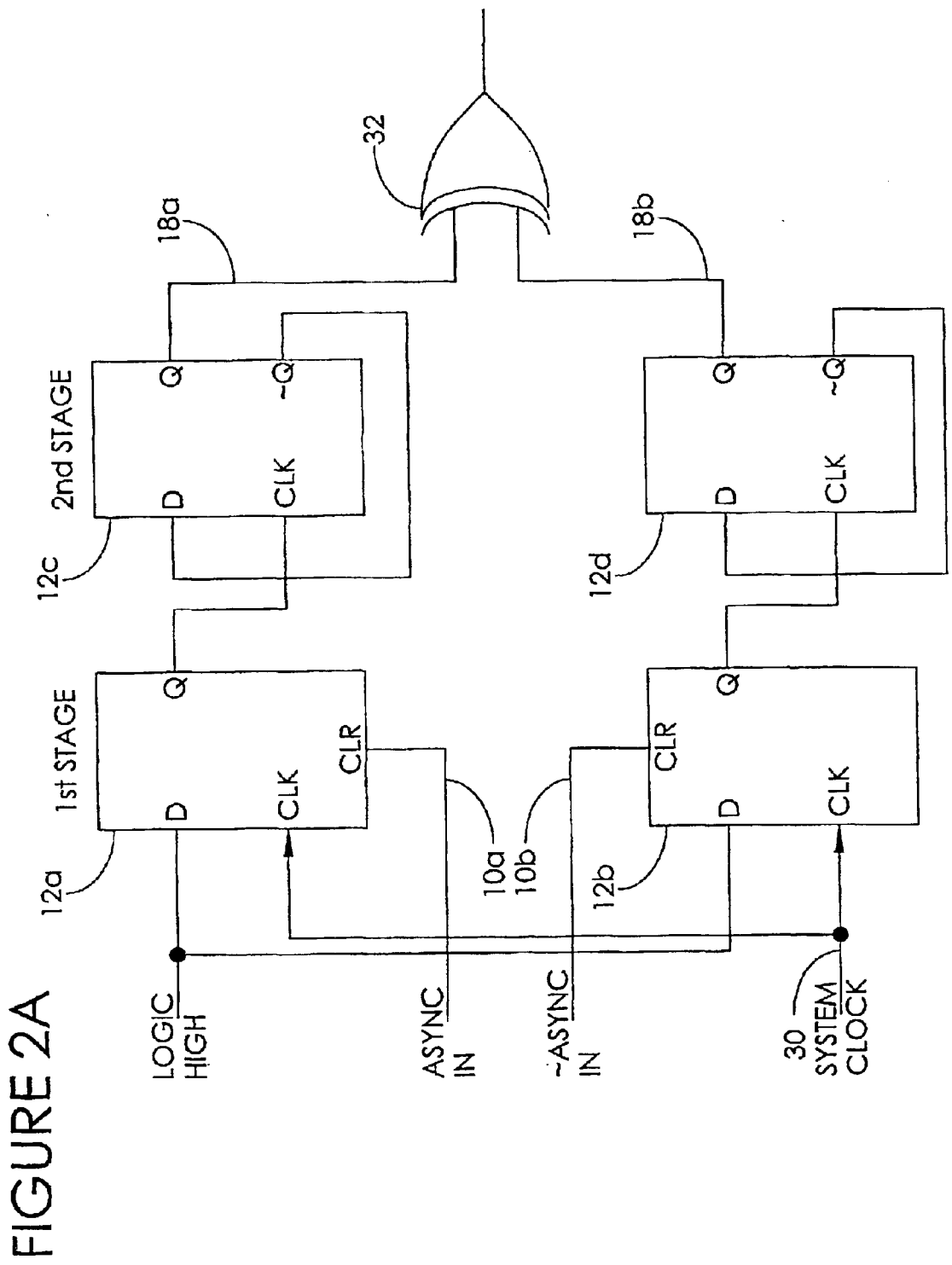
FIG. 2A is a block diagram of the core of the synchronizer of FIG. 1 with a combiner according to one embodiment of the invention.

In one embodiment, the XOR gate 32 recombines the two signals 18a and 18b to produce the synchronized OUT signal 20 at the original data rate, but now synchronized to the system clock 30. The core with the combiner is shown in FIG. 2A.

Logic designers of ordinary skill in the art recognize that equivalent variants to the synchronizer 100 of FIG. 1 may be constructed. For example, logic low levels may be tied to the D inputs of the first stage flip-flops. Further, the preset (PR) inputs (not shown), rather than the CLR inputs, may receive the asynchronous signal. Or, the CLR input of the flip-flop 12a may receive the inverse asynchronous signal 10b, rather than the asynchronous signal 10a in an equivalent circuit. Also, the Q and ~Q outputs of the second stage flip-flops may be reversed for use as partial signals 18.

Circuits Equivalent to the Core

Figure 5A:
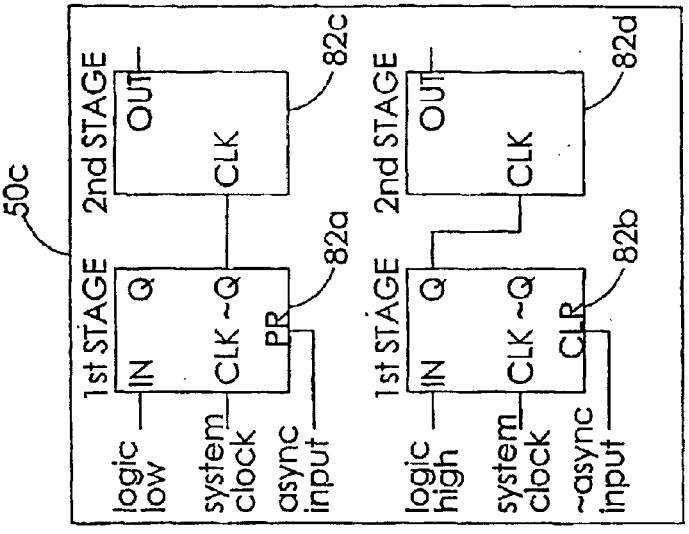
FIGS. 5A–5C are block diagrams of circuits equivalent to the core of FIG. 2 according to one embodiment of the invention.
Figure 5B:
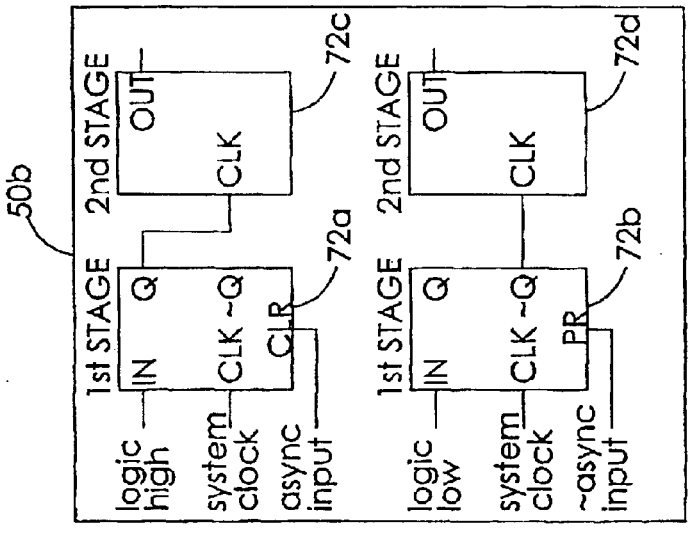
Figure 5C:
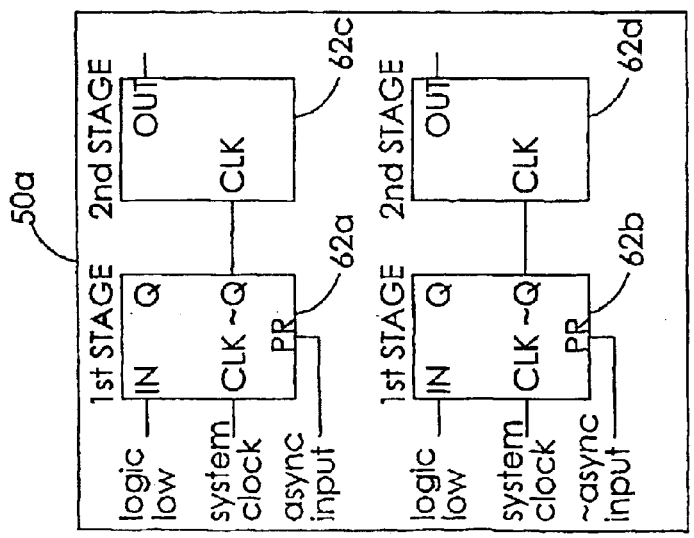

These changes may be observed in FIGS. 5A–5C, in which three equivalent circuits of the core 50 of FIG. 2 are depicted. Core 50a includes flip-flops 62a–d, in which flip-flop 62a receives the asynchronous IN signal 10a into a PR input while flip-flop 62b receives the inverted asynchronous IN signal 10b into a PR input. The ~Q output of flip-flop 62a is received into the second stage flip-flop 62c CLK while the ~Q output of flip-flop 62b is received into the second stage flip-flop 62d CLK. Despite these differences, core 50a is equivalent to the core 50 of FIG. 2.

Core 50b includes flip-flops 72a–d, in which flip-flop 72a receives the asynchronous IN signal 10a into a CLR input and flip-flop 72b receives the inverted asynchronous IN signal 10b into a PR input. Second stage flip-flop 72c receives its CLK input from the Q output of flip-flop 72a while flip-flop 72d receives its CLK input from the ~Q output of flip-flop 72b. The core 50b is likewise equivalent to the core 50.

Core 50c includes flip-flops 82a–d. Flip-flop 82a receives the asynchronous IN signal 10a into a PR input while flip-flop 82b receives the inverted asynchronous IN signal 10b into a CLR input. Second stage flip-flop 82c receives its CLK input from the ~Q output of flip-flop 82a while flip-flop 82d receives its CLK input from the Q output of flip-flop 82b. The core 50c is equivalent to the core 50, as well as to cores 50a and 50b.

Asynchronous Recovery Circuit

To obtain a valid result, the setup ($T_{SU}$) and hold ($T_H$) times for the flip-flop are observed. For the D flip-flop, the D (or data) input is expected to be stable (logic high or logic low) at least $T_{SU}$ prior to the rising edge (or falling edge) of the CLK input and at least $T_H$ after the same rising (falling) edge. Where the setup and hold times are violated, unexpected, or metastable, behavior may result. This metastable behavior is also known as data metastability or data setup and hold metastability.

A similar, but lesser known, constraint is imposed on the preset (PR) or the clear (CLR) inputs. In the case of a D flip-flop, when a PR input is received, the Q output is expected to go high (set); when a CLR input is received, the Q output is expected to go low (clear). When the CLR (PR) input is removed (negated), a certain reset recovery delay, or $T_{RR}$, is expected to occur before the next CLK input is received. When $T_{RR}$ is violated, the flip-flop may exhibit unexpected behavior.

The PR/CLR constraint is lesser known because, typically, the preset and clear inputs are minimally used, such as at the beginning of an operation sequence. In the core of the synchronizer 100, however, the CLR (or, in an equivalent circuit, PR) input receives the asynchronous IN signal 10, which is ostensibly changing often.

Figure 6:
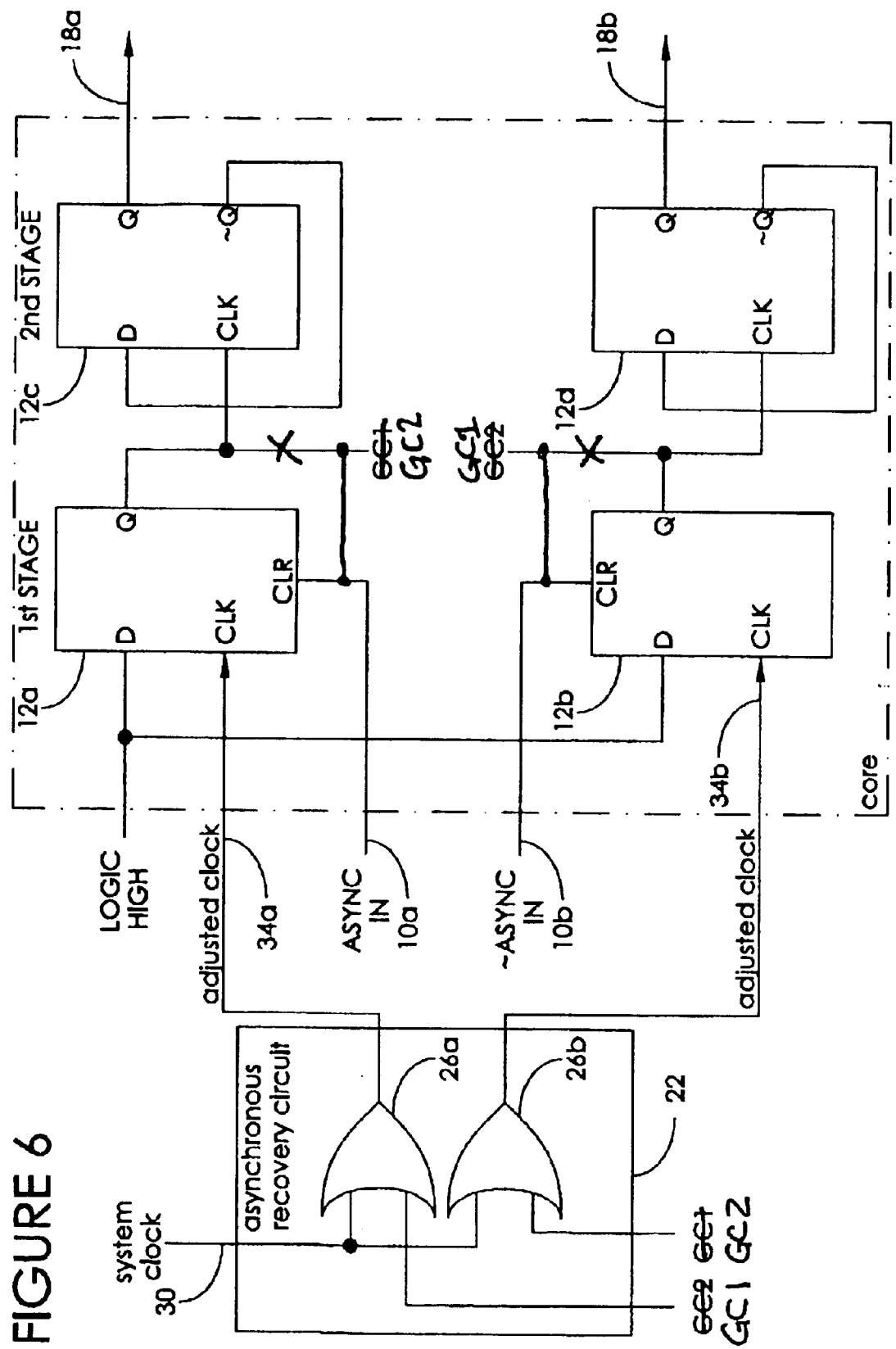
FIG. 6 is a block diagram of the core and the asynchronous recovery circuit of FIG. 1 according to one embodiment of the invention.

Thus, according to one embodiment, the synchronizer 100 utilizes an asynchronous recovery circuit 22 to ensure that the CLK signal following the asynchronous IN signal 10 does not violate $T_{RR}$. The asynchronous recovery circuit 22 and the core 50 are illustrated in FIG. 6. The asynchronous recovery circuit 22 receives the system clock 30 and produces adjusted clock 34 and adjusted clock 34b.

In one embodiment, the asynchronous recovery circuit 22 is a gated clock circuit comprising two two-input OR gates 26, each of which receives the system clock 30 as one of its inputs. The Q outputs from each of the first stage flip-flops (12a and 12b) in the core 50 comprise the second inputs. OR gate 26a receives the Q output from the flip-flop 12b while OR gate 26b receives the Q output from the flip-flop 12a.

Essentially, the asynchronous recovery circuit 22 is a gated clock circuit, and delays the reapplication of the CLK inputs of the first stage flip-flops until some minimum reset recovery time, $T_{RR}$, after the negation of the asynchronous input at each flip-flop. GC1 and GC2 act as "gate controls." When GC1 (GC2) is low, the system clock 30 passes through OR gate 26a (26b), to the first stage flip-flops. When GC1 (GC2) is high, the system clock 30 is stopped. Gate control GC1 will be low when the asynchronous IN signal 10a is high. Gate control GC2 will be low when the asynchronous IN signal 10a is low.

In one embodiment (not shown), the gate control input GC1 is the Q output from the flip-flop 12b, time-correlated to the asynchronous IN signal 10a negation at the flip-flop 12a. Utilizing the propagation delay $T_{PD}$ of the flip-flop 12b plus the propagation delay $T_{GCC}$ of the gated clock circuit 22, the adjusted clock 34a to the flip-flop 12a is delayed after the asynchronous IN signal 10a goes high, providing an inherent recovery time.

Likewise, the gate control input GC2 is the Q output from the flip-flop 12a, time-correlated to the inverted asynchronous IN signal 10b negation at the flip-flop 12b. Utilizing the propagation delay $T_{PD}$ of the flip-flop 12a plus the propagation delay $T_{GCC}$ of the gated clock circuit 22, the adjusted clock 34b to the flip-flop 12b is delayed after the inverted asynchronous IN signal 10b goes high, also providing an inherent recovery time.

If desired, additional gates may be added to the gated clock circuit 22 to achieve a large enough asynchronous reset recovery time $T_{RR}$. In contrast, if the propagation delay $T_{GCC}$ of the gated clock circuit 22 is sufficient, the CLR input, rather than the Q output, of the flip-flop 12a (12b) can function as the gate control input GC1 (GC2).

This Configuration is Depicted in FIG. 6

In one embodiment, the propagation delay of either the flip-flop 12b or of the asynchronous recovery circuit 22 were larger than $T_{RR}$, and, thus, either were sufficient to ensure asynchronous recovery, and thus, proper operation of the flip-flops 12a and 12b. Additionally, logic substitutions may be practiced to accommodate inverted logic. For example, a NAND gate may be used in place of the OR gate 26 to utilize inverted inputs. Alternatively, a NOR gate may be used, where falling-edge flip-flops are employed. Other modifications to the described embodiments, familiar to those of ordinary skill in the art, may likewise be made without departing from the spirit of the invention.

Pulse Width Discriminator

Another phenomenon that may cause flip-flop unpredictability is the receipt of incomplete signals, or "runt" pulses, into the CLK input of the flip-flop. The clock signals received into the flip-flop are expected to have a minimum pulse width, $PW_{min}$.

In the asynchronous recovery circuit 22 of FIG. 6, the clock signals 34a and 34b begin as a falling edge, emerging from a steady high level. The first clock signal 34a (34b) received into the flip-flop 12a (12b) has the potential to be too short on the low-going pulse, where the signal transitions from a logic high state to a logic low state immediately after the reset recovery time $T_{RR}$. Where the clock signal 34a (34b) does not have a pulse width of $PW_{min}$ or higher, unpredictable behavior may result.

Returning to FIG. 1, in one embodiment, the synchronizer 100 includes a pulse width discriminator 16 to avert such unpredictable behavior. The pulse width discriminator 16 keeps the adjusted clock signals 34a and 34b generated by the asynchronous recovery circuit 22 (see FIG. 6) from being transmitted when the signals are shorter than $PW_{min}$.

Figure 7:
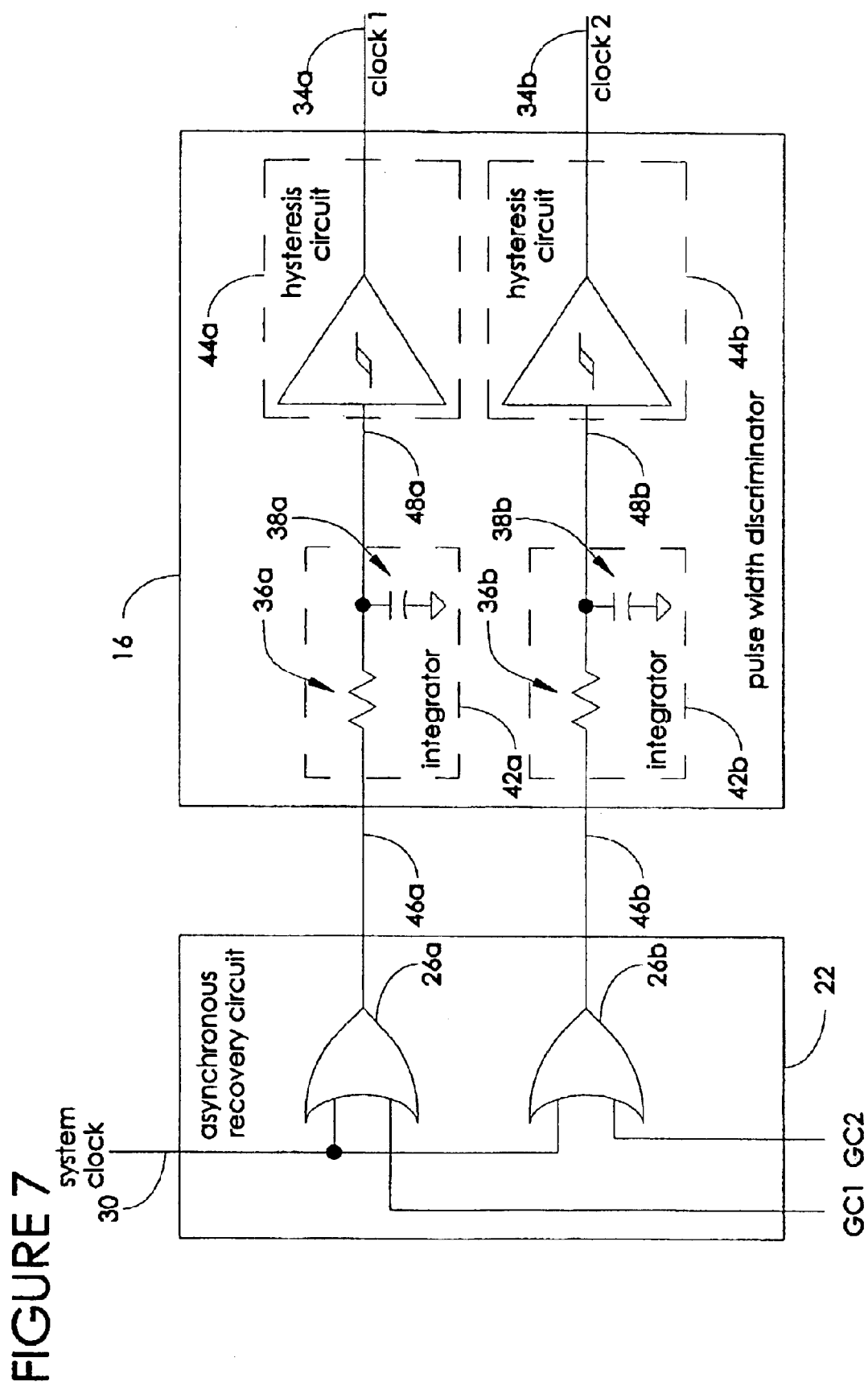
FIG. 7 is a block diagram of the asynchronous recovery circuit and the pulse width discriminator of FIG. 1 according to one embodiment of the invention.

Coupled to the asynchronous recovery circuit 22, the pulse width discriminator 16 includes a pair of integrators 42 and a pair of hysteresis circuits 44, according to one embodiment, in FIG. 7. Integrator 42a and hysteresis circuit 44a prevent pulses with a width less than $PW_{min}$ from being transmitted as adjusted clock 34a. Likewise, integrator 42b and hysteresis circuit 44b prevent pulses with a width less than $PW_{min}$ from being transmitted as adjusted clock 34b.

As in FIG. 6, the asynchronous recovery circuit 22 is a gated clock circuit with two-input OR gates 26a and 26b, each of which receives the system clock 30 as well as gate control signals GC2 and GC1, respectively. The output (46a) of the OR gate 26a is received by the integrator 42a while the output (46b) of the OR gate 26b is received by the integrator 42b.

In one embodiment, the integrator 42a includes a resistor 36a and a capacitor 38a. Likewise, the integrator 42b includes a resistor 36b and a capacitor 38b. An integrator is a circuit that produces an output voltage proportional to the integral of its input voltage. In one embodiment, the integrator 42a (42b) integrates the area of incoming signal 46a (46b), and prevents passage of the signal if the pulse width is less than $PW_{min}$.

The values for the resistors 36 and capacitors 38 may be obtained empirically. Other considerations, such as the parasitic impedance of the circuit, may affect the resistor and capacitor values chosen. Designers of ordinary skill in the art will recognize that the integrators 42a and 42b may comprise a different network of impedance devices, or a different configuration of resistors and capacitors, without departing from the spirit of the invention.

In one embodiment, the hysteresis circuits 44a and 44b are Schmitt triggers. A Schmitt trigger uses two voltage thresholds to control the passage of a signal, an upper threshold level (UTL), to switch the signal during low-to-high transitions; and a lower threshold level (LTL), to switch the signal during high-to-low transitions. Schmitt triggers may prevent aberrant signals, such as runt pulses, from being received by more critical circuitry. The Schmitt triggers 44a and 44b include a hysteresis curve drawn inside the gate symbol. These devices prevent pulses smaller than $PW_{min}$ of the adjusted clocks 34a and 34b from being transmitted, and, thus, from being received by the flip-flops 12a and 12b (see FIG. 6).

As a first case, if the flip-flop 12a receiving the clock signal 34a does not respond to a first low-going clock cycle that is marginally too narrow, then the rising edge of a second clock cycle will be sufficient to provide the clocking to the flip-flop. Under this scenario, the synchronizer 100 functions correctly since the flip-flop responds to the second clock cycle's rising edge, and not the first one. Further, all rising clock edges remain at their correct synchronizing time-locations. Thus, the resulting Q output swings are still predictable synchronized responses. In one embodiment, this scenario occurs if the Q output does not marginally respond to narrow low-going clock pulses below $PW_{min}$.

As a second case, the flip-flop may respond marginally to narrow low-going clock pulses such that the Q output swings marginally instead of not responding. Where the second case occurs, the asynchronous recovery circuit 22 discriminates pulses smaller than $PW_{min}$, allowing pulses the size of $PW_{min}$ or larger to be transmitted. $PW_{min}$ is determined according to the specification of the flip-flops 12.

In FIGS. 8A–8D, timing diagrams illustrate operation of the integrators 36 and the Schmitt triggers 44 of the gated clock circuit 50, according to one embodiment. In each of the timing diagrams, three signals are depicted: the clock output 46a (46b) from the OR gate 26a (26b), the output 48a (48b) from the integrator 36a (36b), and the adjusted clock output 34a (34b) from the Schmitt trigger 44a (44b).

Each timing diagram further includes three vertical lines. A first vertical line, labeled A, indicates the first high-going edge of the Schmitt trigger output. A second vertical line, labeled B, indicates the first low-going edge of the Schmitt trigger output. A third vertical line, labeled C, is a reference point indicating the rising edge of the OR gate output 46 immediately after the failing edge signal that is being analyzed. The falling edge is expected to be at least $PW_{min}$, before the reference point.

Also depicted in FIGS. 8A–8D are horizontal lines UTL and LTL, representing the upper and lower threshold levels of the Schmitt trigger 44. These four timing diagrams are intended for analysis of the pulse width of the first low-going half-cycle of the signal 46, and are not intended as representing all possible scenarios.

In FIG. 8A, the signal 46 is transmitted from the OR gate 26 after receiving one of the gate control signals. The signal 46 is shown as a square wave. When the signal 46 passes through the integrator 42, the edges of the signal are rounded (see integrator output 48). As soon as the first low-going pulse of the rounded signal crosses the LTL, the Schmitt trigger 44 sends the signal 34 out (see vertical line B).

Next, the Schmitt trigger 44 waits for the next high-going pulse of the signal 48 to cross the UTL. When this occurs, the Schmitt trigger 44 sends the signal 34 but (see vertical line A). As indicated by the arrow between the OR gate output 46 and the Schmitt trigger output 34, the rising edge of the clock signal 46 is reflected in the Schmitt trigger output 34. In FIG. 8A, the pulse width of the OR gate output 46 exceeds $PW_{min}$.

In FIG. 8B, the half-cycle of the OR gate output 46 is less than full width, but still exceeds $PW_{min}$. Again, the Schmitt trigger 44 allows the signal 34 to be transmitted. Also, the rising edge of the clock signal 46 is reflected in the Schmitt trigger output 34. Notice that the integrator output 48 barely remains at the voltage low ($VO_L$) level. Nevertheless, the low-going signal 48 crossed the LTL, which allowed the Schmitt trigger to transmit the output 34.

In FIG. 8C, the half cycle of the OR gate output 46 is exactly $PW_{min}$ long. The low-going signal just crosses LTL, causing the Schmitt trigger output 34, to be transmitted. Since a runt pulse is a pulse that is smaller than $PW_{min}$ long, the transmission of the signal 34 is appropriate.

In FIG. 8D, however, the half-cycle of the OR gate output 46 is less than $PW_{min}$ long. Accordingly, the low-going pulse of the integrator output 48 does not cross LTL, and the Schmitt trigger 44 does not transmit the signal. However, the next low-going OR gate output 46 causes the Schmitt trigger 44 to send the adjusted clock signal 34 to the core 50. In one embodiment, the synchronizer 100 prevents runt pulses from being received by the core in the manner described in FIG. 8D.

As with other devices, the integrator 42 and hysteresis circuit 44 have propagation delay $T_{PD}$ that may address the asynchronous recovery time, issue described above. The minimum delay introduced by these components may be part of the reset recovery time ($T_{RR}$), possibly eliminating the need to use the propagation delay of the flip-flops ($T_{PD}$) to ensure asynchronous recovery. For example, if circuitry in the pulse width discriminator 16 and in the asynchronous recovery circuit 22 provide sufficient recovery time, the asynchronous signals 10a and 10b, rather than the Q outputs from the first stage flip-flops, may operate as the gate control signals (GC1 and GC2).

In one embodiment, one or more additional Schmitt triggers are added to the pulse width discriminator 16. The Schmitt trigger 44 feeds at least one additional Schmitt trigger.

An analysis of the integrator and hysteresis circuitry of the pulse width discriminator is provided in a section entitled, "Lumped Parameter Analysis," below.

Inversion Corrector

Looking back to the core in FIGS. 1 and 2, depending on the power-up states of the second stage flip-flops 12c and 12d, the synchronizer 100 may generate an inverted version, in the synchronized signal 20, of the original asynchronous data signal 10.

In some applications, such as communications, the inverted state of the synchronized signal is of no consequence. However, where the polarity of the synchronized signal 20 is expected to be the same as that of the original asynchronous signal, the polarity may be reversed, using methods that are well known among circuit designers.

Figure 9:
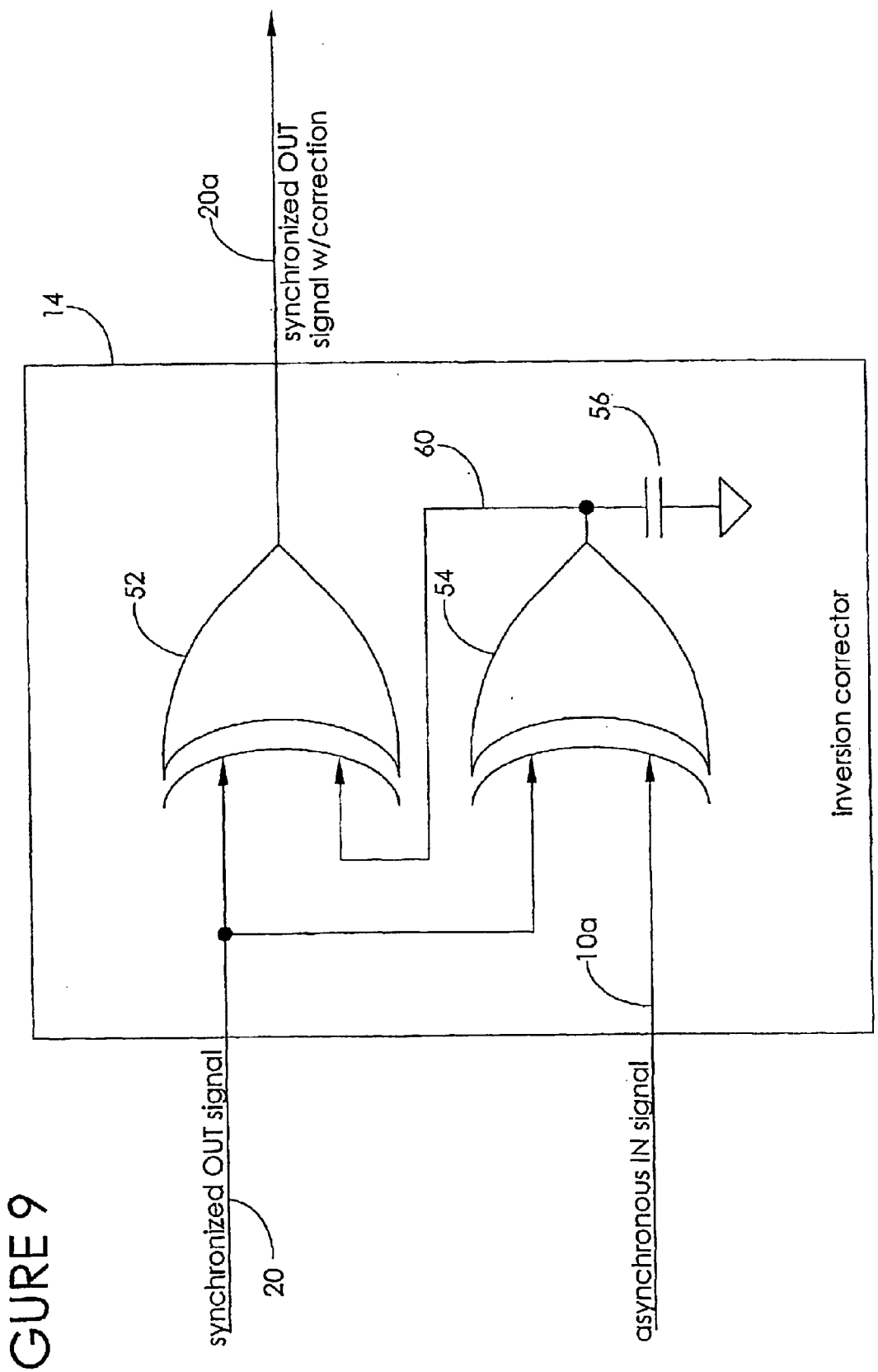
FIG. 9 is a block diagram of the inversion corrector of FIG. 1 according to one embodiment of the invention.

The synchronizer 100 of FIG. 1 thus includes an inversion corrector 14, to correct the inversion of the synchronized signal 20. The inversion corrector 14, according to one embodiment, is depicted in FIG. 9. The inversion corrector includes two two-input XOR gates 52 and 54, as well as a capacitor 56.

The XOR gate 54 receives synchronized signal 20, which may be inverted, into one of its inputs, with the original asynchronous IN signal 10a received as the other input. Any difference between the two signals indicates an inversion of the synchronized signal 20. Accordingly, the output 60 from the XOR gate 54 is a correction signal, to be received by the second XOR gate 52. A capacitor 56 filters out the pulses of the signal 60 which appear as a result of different arrival times between the two signals being compared. The corrected output is received from signal 20a, as shown in FIG. 9.

In one embodiment, the capacitor 56 is selected to minimize the time-to-correction to within two or three clock cycles, while still filtering out the pulses. In a second embodiment, inversion is corrected using circuitry external to the synchronizer 100. This allows the designer to determine the time-to-correction by choosing a capacitor value. As a third embodiment, a selection mechanism may be implemented in which a user elects whether the capacitor 56 within the synchronizer 100 is used or an external capacitor is used.

Typically, the inversion of the synchronized OUT signal (relative to the asynchronous IN signal) occurs after a chaotic event, such as power-on. Thus, the inversion correction mechanism, if needed, is a part of the power-up sequence and should not be necessary after nominal conditions are established. However, noise or marginal signaling may, in some instances, interrupt the inputs to the synchronizer during operation, such as when inputs are disconnected or an input source is in a nonfunctional state. The inversion correction mechanism may thus correct such occurrences, whenever they occur.

Variants

Figure 10:
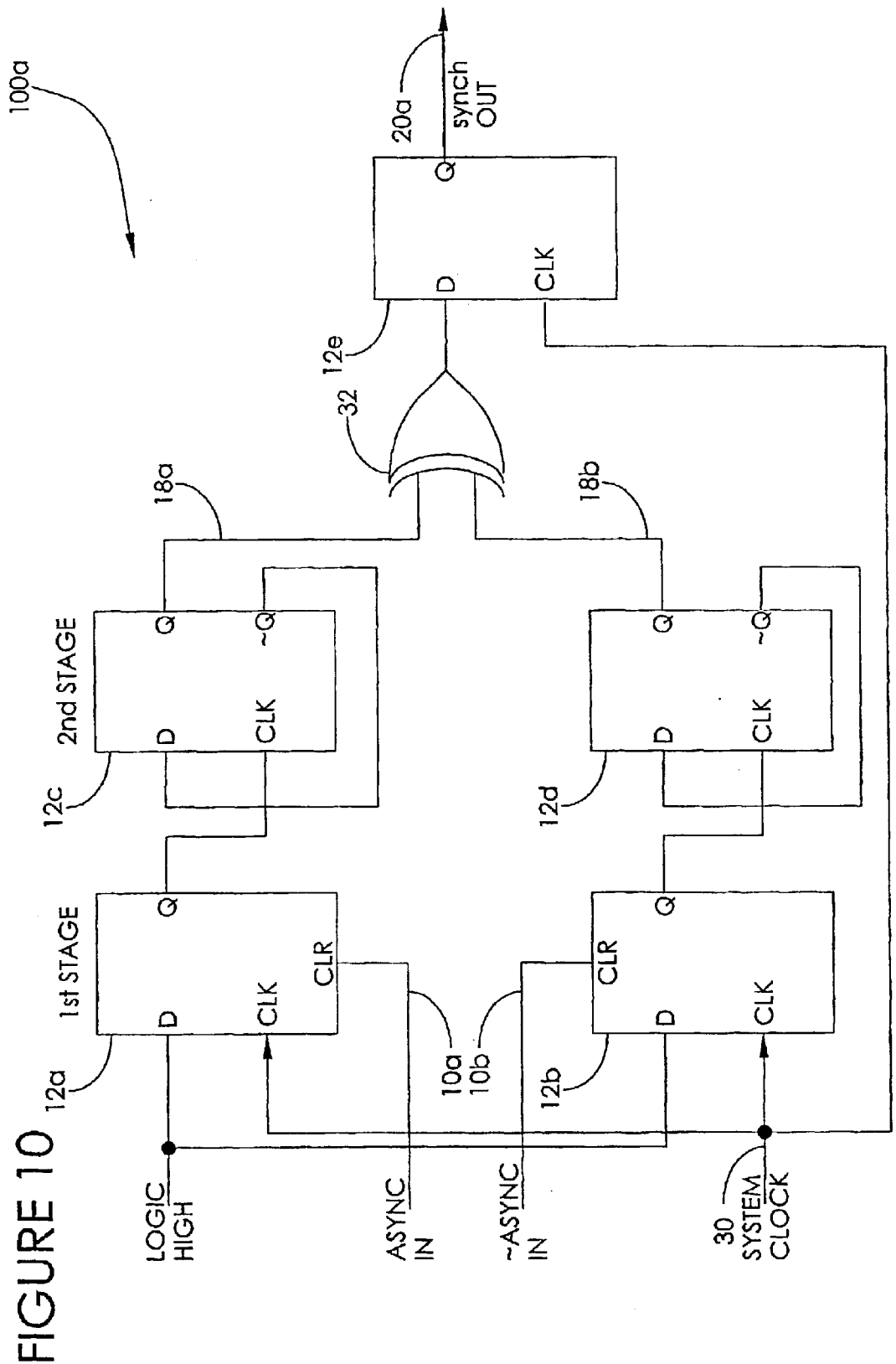
FIG. 10 is a first variant of the synchronizer of FIG. 1 according to one embodiment of the invention.

In FIG. 10, according to one embodiment, a first variant 100a of the synchronizer of FIG. 1 is depicted, in which the synchronizer is pipelined at the synchronized OUT signal 20. In addition to the core 50 (FIG. 2) and the XOR gate 32 (FIG. 4), an additional flip-flop 12e receives the synchronized OUT signal at its input and the system clock as its CLK input. This flip-flop 12e is known as a pipeline stage of the synchronizer 100a. Synchronized output 20a is produced.

Figure 11:
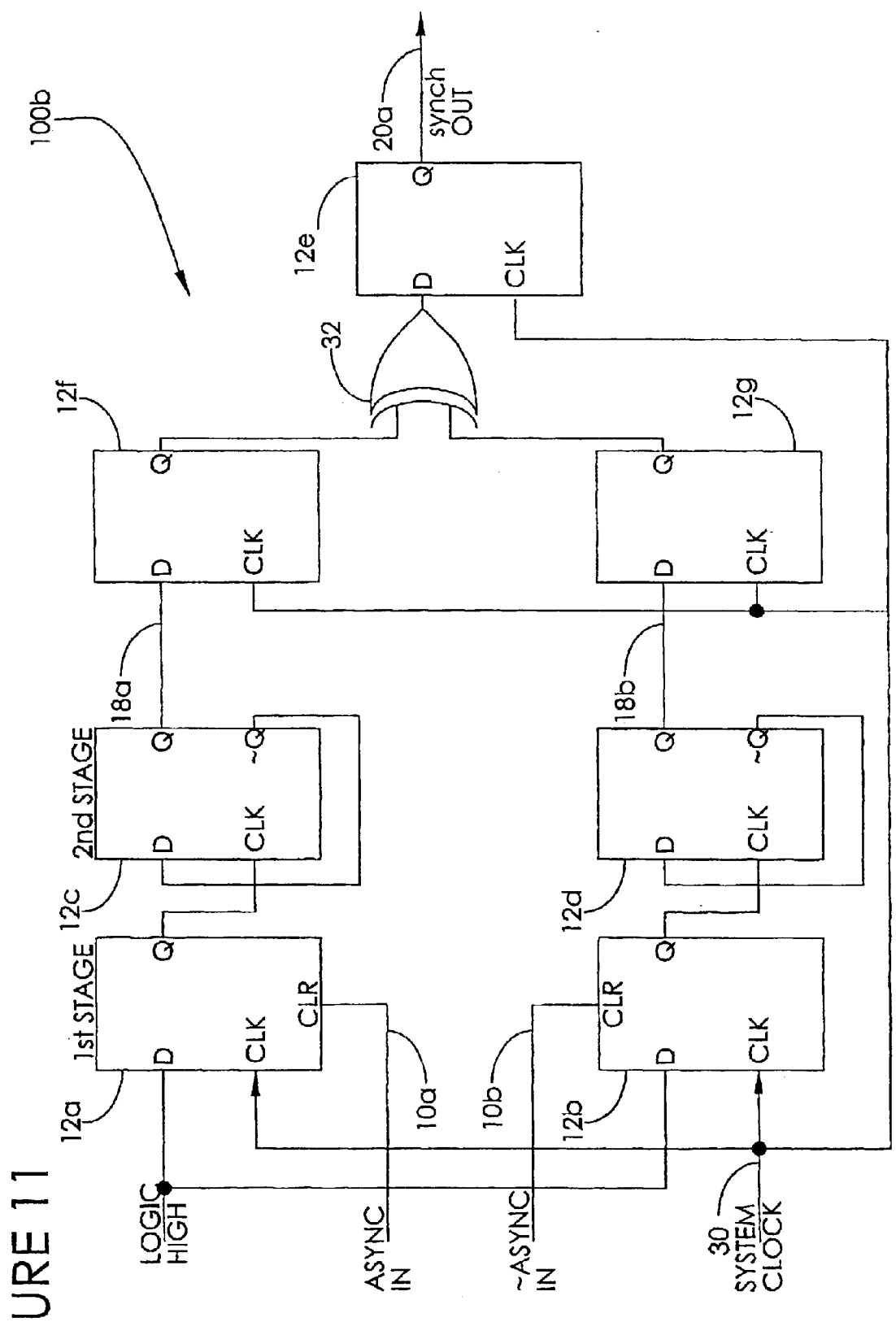
FIG. 11 is a second variant of the synchronizer of FIG. 1 according to one embodiment of the invention.

In FIG. 11, according to another embodiment, a second variant 100b the synchronizer of FIG. 1 is depicted. The synchronizer is pipelined at the partial synchronized outputs 18a and 18b, as shown. In addition to the core 50 (FIG. 2), the synchronizer 100b includes a third stage of flip-flops 12f and 12g, another pipeline stage. As in the first variant, the synchronizer 100b includes the XOR gate 32 (FIG. 4) and the flip-flop 12e.

Figure 12:
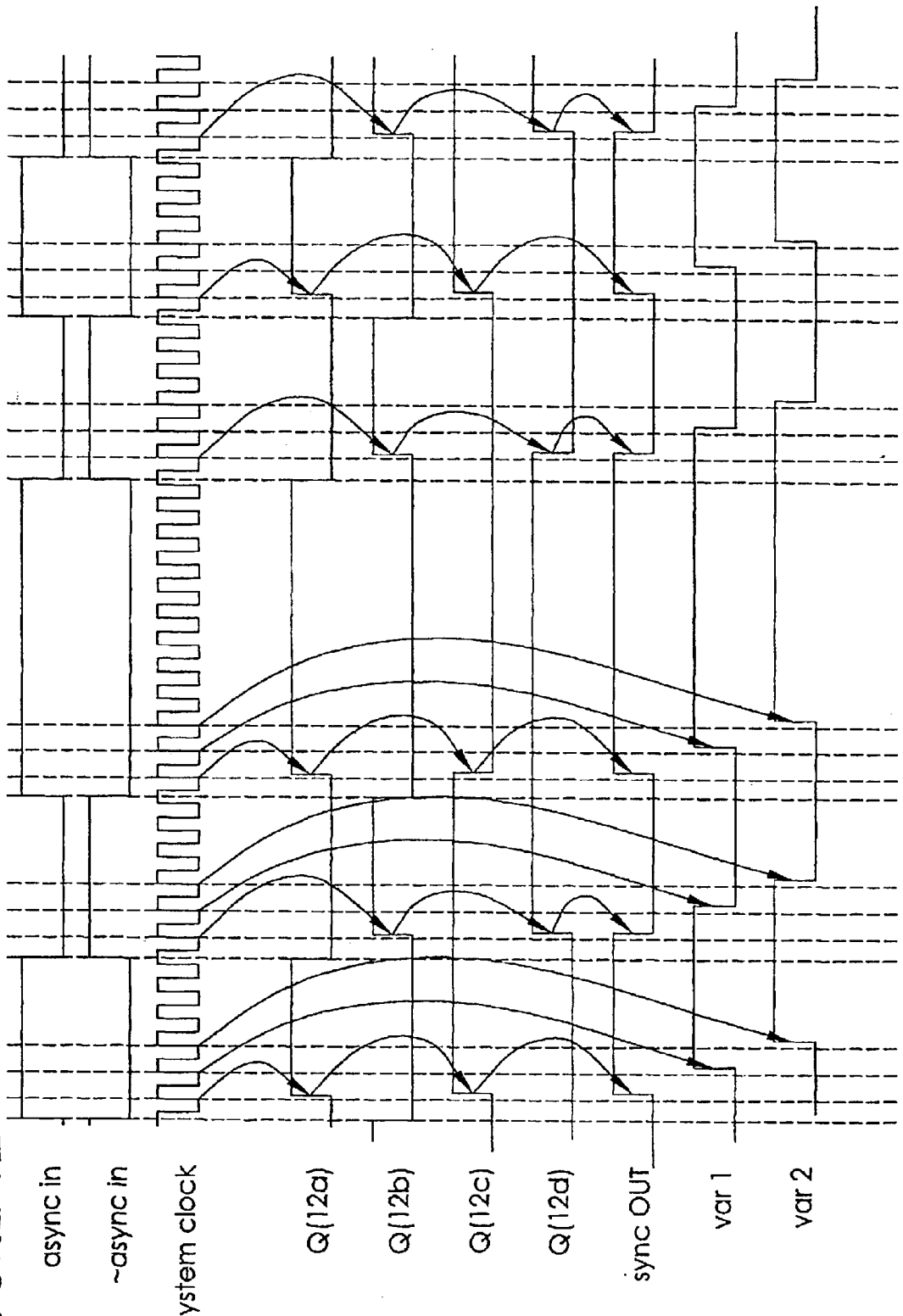
FIG. 12 is a timing diagram of the synchronizers of FIGS. 10 and 11 according to one embodiment of the invention.

In one embodiment, the variants of FIGS. 10 and 11 improve throughput performance by overlapping the propagation times of the flip-flops and the XOR gate. A timing diagram for both variants is depicted in FIG. 12. The latency for the synchronizer 100a is one clock cycle while the latency for the synchronizer 100b is two clock cycles, as shown.

In one embodiment, the synchronizer 100 (and all its variants) generates a completely synchronized replica of the asynchronous IN signal 10 with zero metastability. In prior art synchronizers, the digital designer was left to accept failures, calculate MTFB failure rates based upon vague information from chip manufacturers, and hope for the best. This synchronizer 100, in contrast, represents a paradigm shift by offering a true solution to the metastability problem that has eluded digital designers for almost fifty years.

Lumped Parameter Analysis

As explained above, the pulse width discriminator 50a of FIG. 7 provides for rejection of runt pulses smaller than the specified minimum pulse width, $PW_{min}$, expected at the subsequent flip-flop clock input. The runt pulses are a result of the asynchronous negation edges of the gate control signals GC1 and GC2 of the core.

In one embodiment, the gate control inputs are unpredictable. Consequently, a minimum pulse width $PW_{min}$ from the output 46a (46b) of the OR gate 26a (26b) may not be guaranteed at the re-application of the first clock, cycle coming out of a steady-state high level. However, the pulse width discriminator 50a ensures that the minimum pulse width $PW_{min}$ is met by rejecting the potential runt pulses. The flip-flops 12 of the core thus sees clock pulses of $PW_{min}$ or larger.

As shown in FIGS. 8A–8D, it is only the first re-applied clock cycle that is potentially short, end only on the low side of the cycle, according to one embodiment. The second and following cycles are full cycle width on both the low and the high sides of the cycle. The output rising edges, labeled "A," are launched by the input rising clock edges, and are thus predictable synchronized responses. The logic highs and lows represent $V_{OH}$ and $V_{OL}$ for this analysis.

The integrating RC response, according to one embodiment, is governed by the following equation:

$$E_c = E - (E - E_0)e^{-t/\tau}$$

where $E_c$ is the output voltage at the capacitor 38a (38b), E is the instantaneous OR gate output voltage at time t, $E_0$ is the initial capacitor voltage immediately before time t, and $\tau$ is the RC time constant. In one embodiment, values for the resistor 36a (36b) and the capacitor 38a (38b) are chosen such that the output response voltage $E_c$ results in a hysteresis output pulse width of at least $PW_{min}$.

As expected, the Schmitt trigger 44a (44b) will respond only if its upper threshold level (UTL) is crossed on rising input edges, or if its lower threshold level (LTL) is crossed on falling input edges. In one embodiment, the output of the RC circuit needs to generate a response such that if LTL is crossed after the initial falling edge, the following crossing of UTL is achieved $PW_{min}$ seconds later. Any shorter initial input pulse will not allow the RC response to reach LTL, and rejection occurs by the following hysteresis stage. Thus, the initial capacitor voltage is $E_0$=LTL, the time of interest is t=$PW_{min}$, the applied RC input voltage is $V_{OH}$, and the required RC output voltage is $E_c$=UTL. Substituting these values and solving for $\tau$ results in:

$$UTL = V_{OH} - (V_{OH} - LTL)e^{-PW_{min}/\tau}$$

$$\tau = \frac{-PW_{min}}{\ln\left[\frac{V_{OH} - UTL}{V_{OH} - LTL}\right]} = RC$$

Thus, RC is chosen given these parameters to ensure the generation of a minimum pulse width at the output of the hysteresis circuit 44.

Where the capacitor output just crosses LTL (see FIG. 8C), a theoretical propagation time of exactly $PW_{min}$ after the clock input rising edge may be obtained. This propagation time, however, is added to any inherent propagation time of the circuit. Also, this case represents the minimum added propagation time since a shorter input pulse results in rejection, and, thus, no hysteresis response at all. If the input pulse is wider, then the initial capacitor voltage $E_0$ is some lower value (see FIG. 8B).

FIG. 8B shows that the worst case $E_0$ is the steady-state logic low level $V_{OL}$. With wider input pulse widths, $E_0$ is still $V_{OL}$, as represented in FIG. 8A. The upper propagation time bound is determined by substituting $V_{OL}$ for $E_0$ and solving for t.

$$E_c = E - (E - E_0)e^{-t/\tau}$$

$$UTL = V_{OH} - (V_{OH} - V_{OL})e^{-t/\tau}$$

$$t = \frac{-\tau}{\ln\left[\frac{V_{OH} - UTL}{V_{OH} - LTL}\right]}$$

The propagation time bounds are therefore $$PROP_{min,max} = (PW_{min}, -\tau/\ln[V_{OH} - UTL/V_{OH} - LTL])$$

Thus the input pulses will generate a propagation time that is bounded and predictable relative to the input clock. This predictability is a synchronized response.

The effect of this propagation time is added to the inherent propagation time of the entire circuit, delaying the clock signal to the subsequent flip-flop. Therefore, the end result is simply a bounded delayed output response at the synchronizer output. Relative to the synchronizer clock input, the total propagation delay of the synchronizer includes the additional pulse width discriminator delay and remains a predictable synchronized response to the clock input.

This analysis is offered as a simple basis to build on, as effects such as rise/fall times, voltage level variance, and parasitics are dependent on particular implementation and the technology. The intent is to show that a predictable and bounded timing response is possible when using the pulse width discriminator, and thus a synchronized behavior is maintained.

Alternative Pulse Width Discriminator

The pulse width discriminator of FIG. 7 ensures the minimum clock pulse width $PW_{min}$ is met at the clock inputs of the first stage flip-flop in the core (see FIG. 2). An alternative to the pulse width discriminator is to instead allow the potential small low cycle pulse to clock the flip-flop. Theoretically, the flip-flop clock input circuitry would either sample the constant level or miss the sampling, sampling instead on the next cycle's rising edge.

However, any potential for other behavior at the flip-flop could be mitigated by a voting scheme. A voting scheme assures that a marginal Q-output response would not propagate past the voting circuitry.

Figure 13:
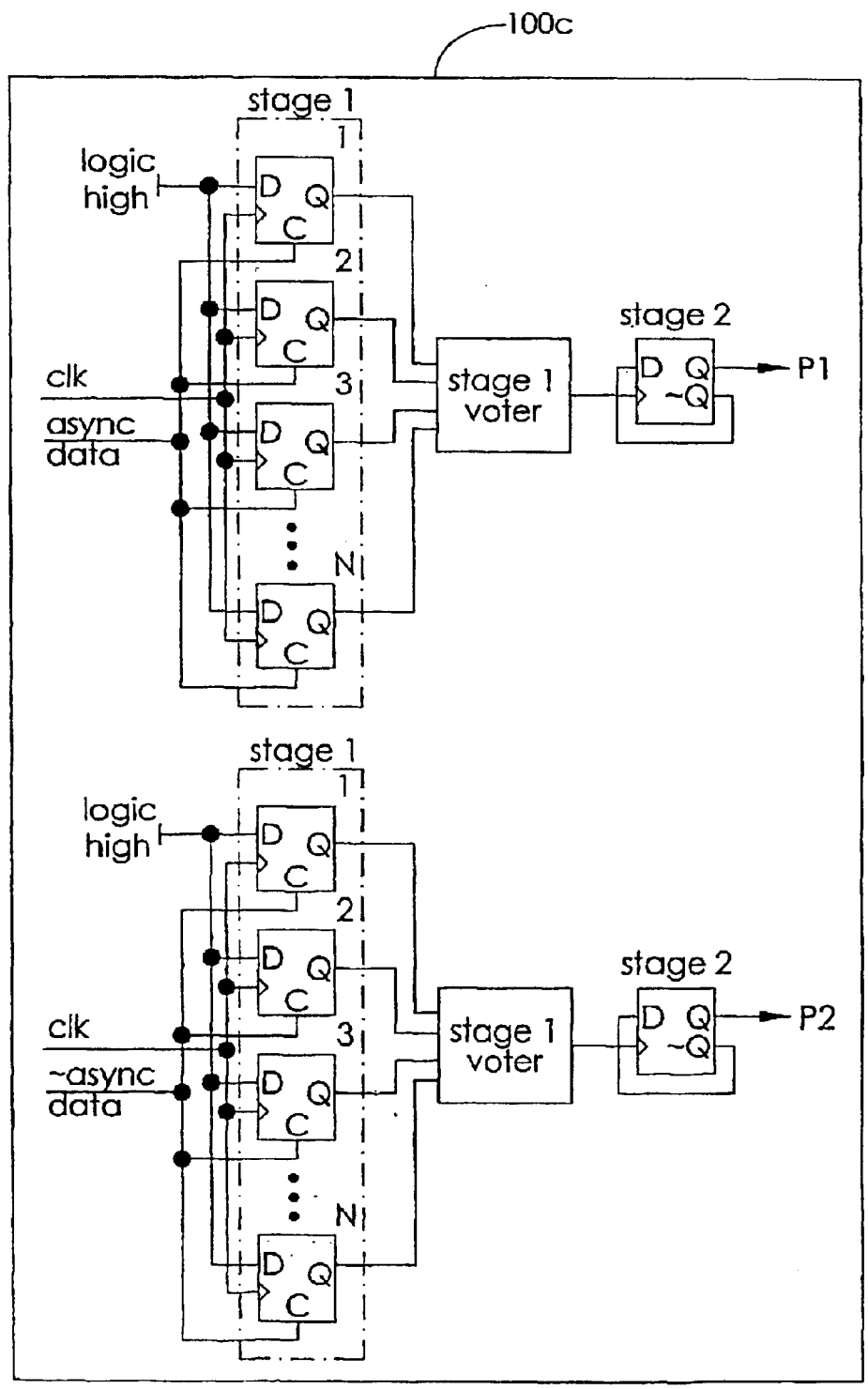
FIG. 13 is a block diagram of a synchronizer with a stage one voter according to one embodiment of the invention.
Figure 6:
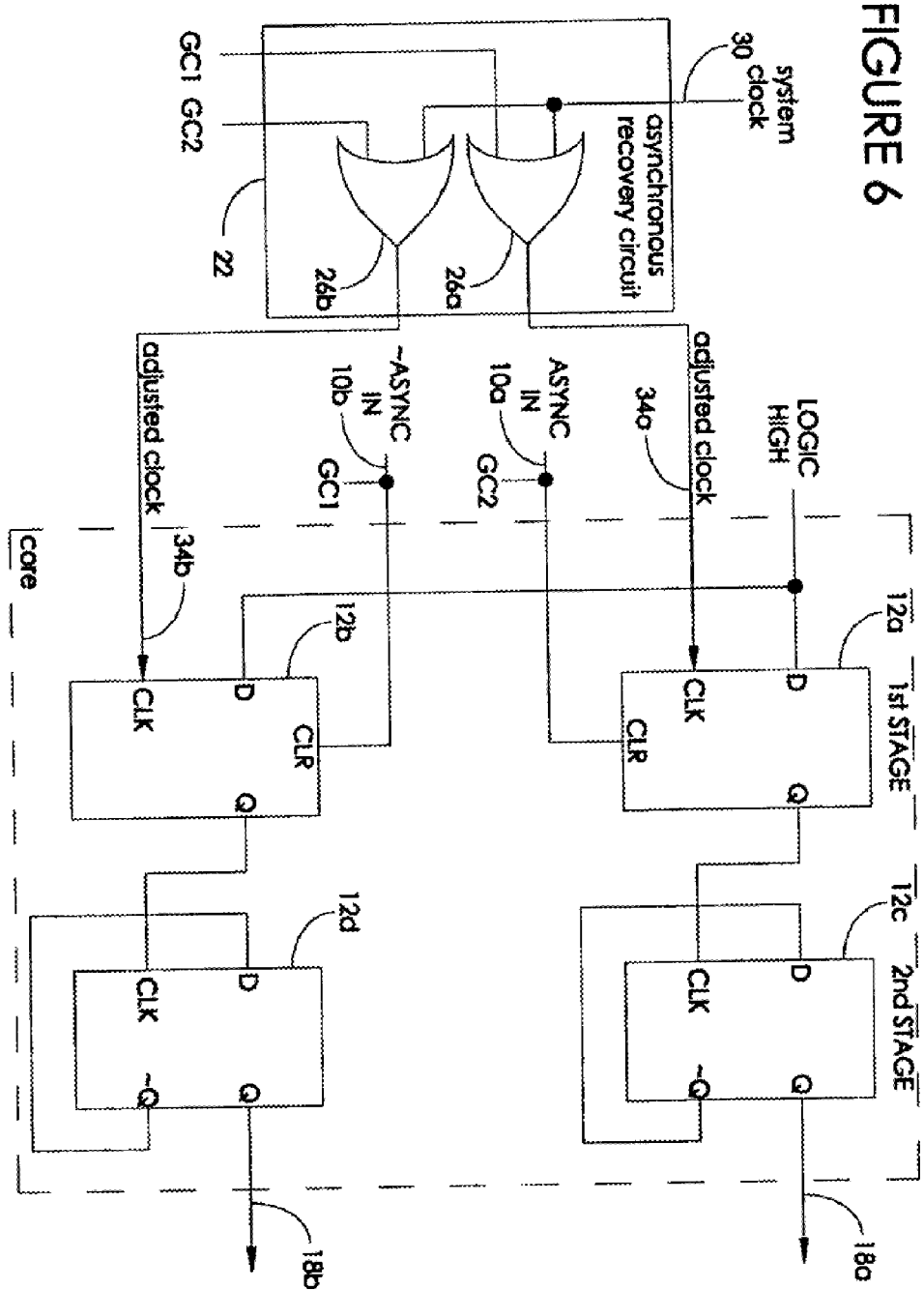

FIG. 13 shows a synchronizer 100*c*, according to one embodiments The synchronizer 100*c* includes an N-way voter circuit (using parallel flip-flops), followed by a voter. Two, three, or more voters may optionally be used, including vote logic.

The voter circuit may be advantageous in that, as more flip-flop voters are added, the clock cycle latency penalty remains zero.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A system comprising a first portion, the first portion comprising:
    a first flip-flop comprising:
        a first flip-flop input tied to a constant logic level;
        a first flip-flop asynchronous input;
        a first flip-flop output; and
    a second flip-flop coupled to the first flip-flop as a toggler, the second flip-flop comprising:
        a second flip-flop clock input coupled the first flip-flop output; and
        a second flip-flop output;
    wherein an asynchronous signal is received into the first flip-flop asynchronous input and a synchronized signal is received from the second flip-flop output.

2. The of claim 1, wherein the constant logic level is a high logic level, the first flip-flop asynchronous input is clear, and the first flip-flop output is a true output.

3. The system of claim 1, wherein the constant logic level is a low logic level, the first flip-flop asynchronous input is a present, and the first flip-flop output is a complement output.

4. The system of claims 2 or 3, further comprising an asynchronous recovery circuit.

5. The system of claim 4, wherein the asynchronous recovery circuit comprises:
    a first gate input for receiving a system clock;
    a second gate input for receiving a gate control signal; and
    a gate output coupled to the first flip-flop clock input.

6. The system of claim 5, wherein the gate control signal is a complement of the asynchronous signal.

7. The system of claim 4, further comprising a pulse width discriminator circuit.

8. The system of claim 7, further the pulse width discriminator circuit comprises:
    an integrator circuit coupled to the asynchronous recovery circuit; and
    a Schmitt trigger comprising:
        a Schmitt trigger input coupled to the integrator circuit; and
        a Schmitt trigger output coupled to the first flip-flop clock input.

9. The system of claim 1, further comprising:
    a second portion comprising:
        a second portion asynchronous input for receiving a complement of the asynchronous signal; and
            a second portion output for producing a second synchronous signal.

10. The system of claim 9, further comprising a combiner circuit comprising:
    a first combiner input for receiving the synchronized signal;

a second combiner input for receiving the second synchronized signal; and
a combiner output.

11. The system of claim 10, wherein the combiner circuit is an XOR circuit.

12. The system of claim 10, wherein the combiner circuit is an XNOR circuit.

13. The system of claim 10, further comprising an inversion corrector circuit.

14. The system of claim 13, wherein the inversion corrector circuit comprises:
a first XOR gate first input coupled to the asynchronous signal;
a first XOR gate second input coupled to the combiner output;
a first XOR gate output coupled to a second XOR gate first input;
a second XOR gate second input coupled to the combiner output;
a first terminal coupled to the second XOR gate first input;
a second terminal coupled to a reference level; and
a second XOR gate output.

15. The system of claim 14, wherein the first terminal and the second terminal comprise a capacitor.

16. The system of claim 10, further comprising a pipeline stage comprising:
a pipeline stage input coupled to the combiner output; and
a pipeline stage output.

17. The system of claim 10, further comprising a pipeline stage comprising:
a pipeline stage first input coupled to the synchronized output;
a pipeline stage second input coupled to the second synchronized output;
a pipeline stage first output coupled to the first combiner input; and
a pipeline stage second output coupled to the second combiner input.

18. A system comprising:
a first flip-flop comprising:
a first flip-flop input tied to a constant logic level;
a first flip-flop output; and
a second flip-flop coupled to the first flip-flop as a toggler, the second flip-flop comprising:
a second flip-flop clock input coupled to the first flip-flop output; and
a second flip-flop output;
wherein an asynchronous signal is received into the first flip-flop asynchronous input and a synchronized signal is received from the second flip-flop output.

19. The system of claim 18, further comprising:
a third flip-flop comprising:
a third flip-flop input tied to a second constant logic level;
a third flip-flop asynchronous input; and
a third flip-flop output; and
a fourth flip-flop coupled to the third flip-flop as a toggler, the fourth flip-flop comprising:
a fourth flip-flop clock input coupled to the third flip-flop output; and
a fourth flip-flop output;
wherein a complement of the asynchronous signal is received into the third flip-flop asynchronous input and a second synchronized signal is received from the fourth flip-flop output.

20. The system of claim 19, further comprising an asynchronous recovery circuit.

21. The system of claim 20, further comprising a pulse width discriminator circuit.

22. The system of claim 19, further comprising a combiner circuit.

23. The system of claim 22, further comprising an inversion corrector circuit.

24. The system of claim 22, further comprising a pipeline stage.

25. A method comprising:
receiving a constant logic level signal by a first flip-flop input;
receiving an asynchronous signal by a first flip-flop asynchronous input;
receiving a first flip-flop output signal by a second flip-flop clock input;
producing a first synchronized signal, wherein the first synchronized signal is synchronized to a system clock signal;
sending the system clock signal to a gate input;
sending a gate control signal to a second gate input; and
sending a first adjusted clock signal to a first flip-flop clock input.

26. The method of claim 25, further comprising:
sending the first adjusted clock signal to an integrator to produce an integrator output signal; and
sending the integrator output signal to a is circuit to produce the first adjusted clock signal.

27. The method of claim 25, further comprising:
receiving a second constant logic level signal by a third flip-flop input;
receiving a complement of the asynchronous signal by a third flip-flop asynchronous input;
receiving a third flip-flop output signal by a fourth flip-flop clock input; and
producing a second synchronized signal, wherein the second synchronized signal is synchronized to the system clock signal.

28. The method of claim 27, further comprising:
sending the system clock signal to a second gate;
sending a second gate control signal to a second gate; and
sending a second adjusted clock signal to the third flip-flop clock input.

29. The method of claim 27, further comprising: combining the synchronized signal with the second synchronized signal to produce a combined synchronized signal.

30. The method of claim 29, further comprising:
inverting the combined synchronized signal.

31. The method of claim 27, further comprising a pipeline stage.

32. A system comprising:
means for receiving a constant logic level signal by a first flip-flop input;
means for receiving an asynchronous signal by a first flip-flop asynchronous input;
means for receiving a first flip-flop output signal by a second flip-flop clock input;
means for producing a first synchronized signal, wherein the first synchronized signal is synchronized to a system clock signal;
means for sending the system clock signal to a gate input;
means for sending a gate control signal to a second gate input; and
means for sending a first adjusted clock signal to a first flip-flop clock input.

33. The system of claim 32, further comprising:
means for sending the first adjusted clock signal to an integrator to produce an integrator output signal; and
means for sending the integrator output signal to a hysteresis circuit to produce the first adjusted clock signal.

34. The system of claim 32, further comprising:
means for receiving a second constant logic level signal by a third flip-flop input;
means for receiving a complement of the asynchronous signal by a third flip-flop asynchronous input;
means for receiving a third flip-flop output signal by a fourth flip-flop clock input; and
means for producing a second synchronized signal, wherein the second synchronized signal is synchronized to the system clock signal.

35. The system of claim 34, further comprising:
means for sending the system clock signal to a second gate;
means for sending a second gate control signal to the gate; and
means for sending a second adjusted clock signal to a third flip-flop clock input.

36. The system of claim 34, further comprising:
means for combining the synchronized signal with the second synchronized signal to produce a combined synchronized signal.

37. The system of claim 36, further comprising:
means for inverting the combined synchronized signal.

38. A system comprising a first portion, the first portion comprising:
a first flip-flop having a setup time and a hold time comprising:
a first flip-flop input tied to a constant logic level; and
a first flip-flop output; and
a second flip-flop coupled to the first flip-flop as a toggle, the second flip-flop comprising:
a second flip-flop clock input coupled to the first flip-flop output; and
a second flip-flop output;
wherein the first flip-flop receives an asynchronous signal during which the setup time of the first flip-flop is not violated.

39. The system of claim 38, wherein the hold time of the flip-flop is not violated.

40. The system of claim 39, further comprising an asynchronous recovery circuit.

41. The system of claim 40, wherein the asynchronous recovery circuit comprises:
a first gate input for receiving a system clock;
a second gate input for receiving a gate control signal; and
a gate output coupled to the first flip-flop clock input.

42. The system of claim 41, wherein the gate control signal is a complement of the asynchronous signal.

43. The system of claim 40, further comprising a pulse width discriminator circuit.

44. The system of claim 43, wherein the pulse width discriminator circuit comprises:
an integrator circuit coupled to the asynchronous recovery circuit; and
a Schmitt trigger comprising:
a Schmitt trigger input coupled to the integrator circuit; and
a Schmitt trigger output coupled to the first flip-flop clock input.

45. The system of claim 38, further comprising:
a second portion comprising a setup time and a hold time, the second portion comprising:
a second portion asynchronous input for receiving a complement of the asynchronous signal; and
a second portion output for producing a second synchronized signal,
wherein the second portion hold time is not violated.

46. The system of claim 45, wherein the second portion setup time is not violated.

47. The system of claim 45, further comprising:
a combiner circuit comprising:
a first combiner input for receiving the synchronized signal;
a second combiner input for receiving the second synchronized signal; and
a combiner output.

48. The system of claim 47, wherein the combiner circuit is an XOR circuit.

49. The system of claim 47, wherein the combiner circuit is an XOR circuit.

50. The system of claim 47, further comprising an inversion corrector circuit.

51. A method comprising:
receiving a constant logic level signal by a first flip-flop input;
receiving an asynchronous signal by a first flip-flop asynchronous input;
producing a first synchronized signal, wherein the first synchronized signal is synchronized to a system clock signal and the first flip-flop is free of data setup and hold time metastability;
sending the system clock signal to a gate input;
sending a gate control signal to a second gate input; and
sending a first adjusted clock signal to a first flip-flop clock input.

52. The method of claim 51, further comprising:
sending the first adjusted clock signal to an integrator to produce an integrator output signal; and
sending the integrator output signal to a hysteresis circuit to produce the first adjusted clock signal.

53. The method of claim 52, further comprising:
receiving a second constant logic level signal by a third flip-flop input;
receiving a complement of the asynchronous signal by a third flip-flop asynchronous input; and
producing a second synchronized signal, wherein the second synchronized signal is synchronized to the system clock signal and the third flip-flop is free of data setup and hold time metastability.

54. The method of claim 53, further comprising:
sending the system clock signal to a second gate;
sending a second gate control signal to the second gate; and
sending a second adjusted clock signal to the third flip-flop clock input.

55. The method of claim 53, further comprising:
combining the synchronized signal with the second synchronized signal to produce a combined synchronized signal.

56. The method of claim 55, further comprising:
inverting the combined synchronized signal.

57. A system comprising:
a first flip-flop to receive an asynchronous input; and
a second flip-flop to operate as a toggler coupled to the first flip-flop,
wherein the first flip-flop exhibits no data setup and hold time metastable behavior.

* * * * *

UNITED STATES PATENT AND TRADEMARK OFFICE
CERTIFICATE OF CORRECTION

PATENT NO. : 6,771,099 B2
APPLICATION NO. : 10/344488
DATED : August 3, 2004
INVENTOR(S) : Jose Alberto Cavazos and Robert Maurise Simle It is certified that error appears in the above-identified patent and that said Letters Patent is hereby corrected as shown below:

Please replace Figure 6 with the attached Figure 6.

Signed and Sealed this

Twenty-ninth Day of April, 2008

JON W. DUDAS
*Director of the United States Patent and Trademark Office*